(12) United States Patent
Matsui et al.

(10) Patent No.: US 8,319,932 B2
(45) Date of Patent: Nov. 27, 2012

(54) WIRING BOARD AND LIQUID CRYSTAL DISPLAY DEVICE

(75) Inventors: Takashi Matsui, Osaka (JP); Motoji Shiota, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 269 days.

(21) Appl. No.: 12/673,307

(22) PCT Filed: Jul. 17, 2008

(86) PCT No.: PCT/JP2008/062956
§ 371 (c)(1),
(2), (4) Date: Feb. 12, 2010

(87) PCT Pub. No.: WO2009/022522
PCT Pub. Date: Feb. 19, 2009

(65) Prior Publication Data
US 2011/0199569 A1    Aug. 18, 2011

(30) Foreign Application Priority Data
Aug. 10, 2007    (JP) ................................. 2007-210344

(51) Int. Cl.
*G02F 1/1345* (2006.01)
(52) U.S. Cl. .......................... 349/151; 349/149; 349/152
(58) Field of Classification Search .................. 349/149, 349/151, 152
See application file for complete search history.

(56) References Cited

U.S. PATENT DOCUMENTS

| | | |
|---|---|---|
| 6,525,422 B1 | 2/2003 | Ono et al. |
| 6,933,607 B2 | 8/2005 | Ono et al. |
| 7,005,741 B2 | 2/2006 | Ono et al. |
| 2002/0071086 A1 | 6/2002 | Kim |
| 2002/0180900 A1* | 12/2002 | Chae et al. ....................... 349/43 |
| 2003/0067072 A1 | 4/2003 | Ono et al. |
| 2004/0027508 A1* | 2/2004 | Akiyama et al. ................. 349/56 |
| 2004/0085504 A1* | 5/2004 | Kim et al. ...................... 349/149 |
| 2004/0165138 A1 | 8/2004 | Hwang et al. |

(Continued)

FOREIGN PATENT DOCUMENTS

JP    5-29377    2/1993

(Continued)

OTHER PUBLICATIONS

International Search Report for PCT/JP2009/057356, mailed Jul. 7, 2009.

(Continued)

*Primary Examiner* — Jessica M Merlin
(74) *Attorney, Agent, or Firm* — Nixon & Vanderhye P.C.

(57) ABSTRACT

A wiring board of the present invention (1) is arranged so that: pads (30) arranged in a plurality of rows include: first-row pads (30a) connected to first metal wires (10a) among metal wires (10); and second-row pads (30b) connected to second metal wires (10b) among the metal wires (10), the first metal wires (10a) being longer than the second metal wires (10b); each of the first metal wires (10a) is formed so as to be separated from a corresponding one of the second-row pads (30b) by at least an insulating layer, and so as to have a widthwise center in a lower region below the corresponding second-row pad (30b); and each of the first metal wires (10a) has widthwise edges provided, in a plan view, beyond widthwise edges of a corresponding one of the second-row pads (30b) in a region in which the first metal wire (10a) overlaps with the corresponding second-row pad (30b).

10 Claims, 19 Drawing Sheets

U.S. PATENT DOCUMENTS

| | | | |
|---|---|---|---|
| 2005/0194678 A1* | 9/2005 | Chuang | 257/734 |
| 2006/0231846 A1* | 10/2006 | Hong et al. | 257/79 |
| 2007/0188693 A1 | 8/2007 | Hwang et al. | |
| 2011/0075088 A1 | 3/2011 | Matsui et al. | |

FOREIGN PATENT DOCUMENTS

| | | |
|---|---|---|
| JP | 11-282012 | 10/1999 |
| JP | 11-307902 | 11/1999 |
| JP | 2002-202522 | 7/2002 |
| JP | 2004-252466 | 9/2004 |
| JP | 2005-252226 | 9/2005 |
| JP | 2005-294615 | 10/2005 |

OTHER PUBLICATIONS

International Search Report for PCT/JP2008/062956, mailed Sep. 22, 2008.

U.S. Appl. No. 12/673,440, filed Feb. 12, 2010, entitled "Wiring Board and Liquid Crystal Display Device".

U.S. Office Action mailed Jul. 27, 2012 in U.S. Appl. No. 12/673,440.

Notice of Allowance from U.S. Appl. No. 12/995,578 mailed Jun. 27, 2012; Matsui.

Office Action from U.S. Appl. No. 12/673,440 mailed Jul. 27, 2012; Matsui.

* cited by examiner

F I G. 1 0
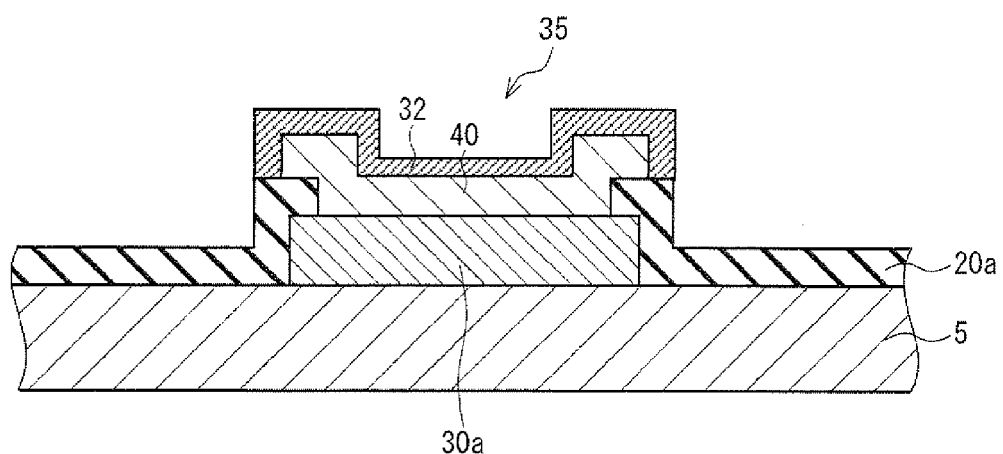

WIRING BOARD AND LIQUID CRYSTAL DISPLAY DEVICE

This application is the U.S. national phase of International Application No. PCT/JP2008/062956, filed 17 Jul. 2008, which designated the U.S. and claims priority to Japanese Patent Application No. 2007-210344, filed Aug. 10, 2007, the entire contents of each of which are hereby incorporated by reference.

TECHNICAL FIELD

The present invention relates to a wiring board. In particular, the present invention relates to a wiring board having pads arranged in a plurality of rows and to a liquid crystal display device including such a wiring board.

BACKGROUND ART

Conventionally, there has been widely used a wiring board having pads arranged in a so-called plurality of rows for a narrow-pitch mounting.

In view of a demand for further reduction in size and weight of electronic devices including the wiring board, electronic components in each of such electronic devices are mounted at a higher density. Accordingly, the wiring board on which the electronic components are mounted are required to have a narrower pitch.

(Patent Literature 1)

In order to meet such a demand, various techniques have been suggested. Patent Literature 1, for example, discloses a technique to arrange a wiring board having pads provided in a plurality of rows. In the technique, the pads are provided in a layer different from a layer in which metal wires each extending between pads adjacent to each other are provided, and the pads have a dual structure. This is described below with reference to FIGS. 15 and 16. FIG. 15 is a view illustrating a configuration of the wiring board disclosed in Patent Literature 1. FIG. 16 is a cross-sectional view taken along line H-H of FIG. 15. The legends "FIRST ROW" and "SECOND ROW" in FIG. 15 indicate respective names of the plurality of rows of pads 105.

The wiring board 100 disclosed in Patent Literature 1, as illustrated in FIG. 15, is provided with metal wires 101 each provided so as to extend between pads 105 in the second row and so as to be connected to a corresponding pad 105 in the first row among all pads 105 arranged in the plurality of rows. The metal wire 101 is provided, as illustrated in FIG. 16, in a layer different from a layer in which the pads 105 in the second row are provided. More specifically, each pad 105 is provided in a layer above the metal wires 101 via an interlayer insulating layer 102 and which is thus different from the layer in which the metal wires 101 are provided.

Each pad 105 in the first and second rows is connected, via a through hole 103, to a corresponding metal wire 101 provided in the layer different from the layer in which the pad 105 is provided (see FIG. 15). Further, a pad 109 having an area larger than that of the pad 105 is provided, via an interlayer insulating layer 106, in a layer above the layer in which the pad 105 is provided. The pad 105 is connected to the pad 109 via a pad through hole 107 (see FIG. 15). In other words, the metal wire 101, the pad 105, and the pad 109 are formed in different layers, respectively. In other words, the metal wire 101 is formed in a first layer; the pad 105 is formed in a second layer; and the pad 109 is formed a third layer.

As described above, according to the wiring board 100 disclosed in Patent Literature 1, the metal wire 101 provided between second-row pads 105 is provided in the layer different from the respective layers of the pad 105 and the pad 109 (the interlayer insulating layer 102 is provided in a layer above the metal wire 101). This makes it possible to reduce a distance between adjacent second-row pads 109 to some extent.

(Patent Literature 2)

With reference to Patent Literature 2, the following describes an example case in which a wiring board on which electronic components are mounted is used as a display device substrate (a substrate for a display device).

Patent Literature 2 discloses a configuration in which pads are arranged on a liquid crystal panel in a plurality of rows in the same manner as in Patent Literature 1. The following description refers to FIGS. 23 to 25. FIG. 23 is a view illustrating a configuration of the liquid crystal panel disclosed in Patent Literature 2. FIG. 24 is a view illustrating a configuration of a bottom surface of a driving integrated circuit (IC) illustrated in FIG. 23. FIG. 25 is a view illustrating the liquid crystal panel on which the driving IC illustrated in FIG. 24 is mounted.

As illustrated in FIG. 23, the liquid crystal panel 300 disclosed in Patent Literature 2 has a driving IC 400 mounted directly thereon (chip on glass (COG) mounting). As illustrated in FIG. 24, the driving IC 400 that is COG-mounted on the liquid crystal panel 300 has a bottom surface having bumps 410 arranged in a plurality of rows. Further, as illustrated in FIG. 25, the liquid crystal panel 300 has a region in which the driving IC 400 is to be mounted. This region has electrode pads 320 that are formed therein so as to correspond to the respective bumps 410 formed on the bottom surface of the driving IC 400. Each of the electrode pads 320 is connected to an input line 310 which is a line connected to a pad.

Citation List

Patent Literature 1

Japanese Patent Application Publication, Tokukaihei, No. 5-29377 A (Publication Date: Feb. 5, 1993)

Patent Literature 2

Japanese Patent Application Publication, Tokukai, No. 2004-252466 A (Publication Date: Sep. 9, 2004)

SUMMARY OF INVENTION (Leak Failure)

The arrangement of Patent Literature 1 unfortunately tends to cause a problem of a leak failure between a pad 109 and a metal wire 101 when an electronic component such as a driving IC is mounted. The following description refers to FIG. 17. FIG. 17 is a view schematically illustrating a condition where an electric component is being mounted to a wiring board.

As illustrated in FIG. 17, when a bump 120 formed on a driving IC is joined to the wiring board 100 via an anisotropic conductive film (ACF) 130 in mounting the driving IC, a pressure (indicated by an arrow in FIG. 17) is applied to the wiring board 100. This pressure may act on a section between a pad 109 and a metal wire 101 and cause the pad 109 to come in contact with the metal wire 101, which may cause a leak failure. The contact between the pad 109 and the metal wire 101 is likely to occur in a region (short region RS1 in FIG. 17) where the pad 109 and the metal wire 101 are closest to each other.

Further, as illustrated in FIG. 17, the above leak failure is more likely to occur especially in a case where the driving IC is misaligned when mounted, and the bump 120 is thereby displaced relative to the pad 109.

As described above, a leak failure occurs in the case where a corner portion of a connecting line formed between pads adjacent to each other comes into contact with one of the pads.

(Narrower Pitch)

In order to prevent occurrence of a leak failure of the above case, each pad may be disposed farther away from nearby connecting lines. As a specific example, in the wiring board illustrated in FIG. 17, the pad 109 may be disposed farther away from the metal wire 101 along a planar direction (in the region RS1 shown in FIG. 17, a distance between the pad 109 and the metal wire 101 is widened along the planar direction).

In this arrangement, the pad 109 is disposed away from the metal wire 101. This prevents the occurrence of a leak failure in the region RS1.

However, if a metal wire 101 is formed between pads 109 adjacent to each other and the distance between the metal wire 101 and each of the pads 109 is widened, a resultant distance between the adjacent pads 109 are also widened.

This indicates that, while the above arrangement does prevent the occurrence of a leak failure of the above case, the above arrangement problematically prevents reduction of a pitch between pads 109.

The present invention has been accomplished in the view of the above problems. An object of the present invention is to provide a wiring board and a liquid crystal display device, each of which makes a leak failure difficult to occur and also makes it possible to have a narrower pad pitch.

In order to solve the above problems, a wiring board of the present invention includes a substrate; pads provided in a plurality of rows on the substrate; and; and connecting lines formed on the substrate and each connected to one of the pads, the pads arranged in the plurality of rows including: first-row pads connected to first connecting lines; and second-row pads connected to second connecting lines, the first connecting lines being longer than the second connecting lines, each of the first connecting lines being formed so as to be separated from a corresponding one of the second-row pads by at least an insulating layer, and so as to have a widthwise center in a lower region below the corresponding second-row pad, each of the first connecting lines having widthwise edges provided, in a plan view, beyond widthwise edges of a corresponding one of the second-row pads in a region in which the first connecting line overlaps with the corresponding second-row pad.

According to the above arrangement, among the pads arranged in a plurality of rows, the first connecting lines are connected to respective corresponding first-row pads while no main portions of the first connecting lines are provided between second-row pads adjacent to each other.

The following describes this arrangement in reference to an example case where the wiring board is used as a glass substrate for a liquid crystal display device. This glass substrate has metal wires and the like formed thereon. Suppose, for example, that thin film transistors (TFTs) formed on a center section of the glass substrate for a liquid crystal display device need to be connected to, e.g., an integrated circuit (IC) having bumps arranged in a plurality of rows. In this case, the first-row pads among the pads on the board to which the IC is to be mounted are each connected to a wire drawn from one of the TFTs while a widthwise center of each connecting line is not provided between second-row pads adjacent to each other.

(Narrower Pitch)

The above arrangement achieves a narrower pad pitch. Specifically, according to the above arrangement, each first connecting line has a widthwise center in a lower region below a pad. This makes it possible to form, in a lower region below the pad, most of such a connecting line in regard to a line width required for a connecting line.

This consequently allows each first connecting line to secure a line width required for a connecting line, without disposing a large portion of such a connecting line in regard to a widthwise direction beyond the lower region below the pad, i.e., between second-row pads adjacent to each other.

As a result, even in a case where a distance between second-row pads adjacent to each other is reduced, a contact between a second-row pad and a connecting line adjacent to the second-row pad or between connecting lines adjacent to each other is unlikely to occur. This in turn facilitates achieving a narrower pad pitch.

(Leak Failure)

According to the wiring board of the present invention, each first connecting line is formed so as to have a widthwise center in a lower region below a corresponding second-row pad. In other words, the connecting line is not formed in a pattern such that a widthwise center of the connecting line is provided between second-row pads adjacent to each other. This reduces a risk of any second-row pad coming close to and thereby coming into contact with a corner portion of a connecting line formed between the second-row pad and its adjacent second-row pad. This in turn reduces a risk of the occurrence of a leak failure, especially the type of leak failure described above with reference to FIG. 17.

Specifically, regarding the contact between a pad and a connecting line, in a case where each first connecting line is formed between pads adjacent to each other and a distance between each of such pads and the connecting line is arranged to be small for attaining a narrower pitch, the pad is likely to come into contact with a corner portion of the connecting line in a region where the distance is small. In addition, in a case where an electronic component or the like is mounted to pads, or especially in a case where such an electronic component is mounted to pads in a misaligned manner, the above contact is likely to occur due to a force applied so as to press the pads against the substrate.

In view of this, according to the wiring board of the present invention, a widthwise center of a connecting line is not provided between pads adjacent to each other. This reduces the risk of a leak failure occurring due to the above contact between a pad and a corner portion of a connecting line.

As described above, the wiring board having the above arrangement reduces the risk of the occurrence of a leak failure, and also achieves a narrower pad pitch at the same time.

The wiring board of the present invention may be arranged so that each of the second-row pads is formed by increasing a line width of a corresponding one of the second connecting lines.

According to the above arrangement, each second-row pad is formed by increasing a line width of a connecting line. This allows the second-row pads to be each formed by a simple method in a region that overlaps with a connecting line connected to a corresponding first-row pad.

The wiring board of the present invention may preferably be arranged so that the second-row pads are softer than the first connecting lines.

The wiring board of the present invention may be arranged so that the second-row pads are made of aluminum; and the first connecting lines are made of any one of titanium, titanium nitride, an alloy of titanium and titanium nitride, tantalum, tantalum nitride, and an alloy of tantalum and tantalum nitride.

The wiring board of the present invention may be arranged so that the second-row pads are made of aluminum or titanium; and the first connecting lines are made of nickel.

According to the above arrangement, the pads in an upper layer are softer than the connecting lines in a lower layer. This further reduces the risk of a leak failure occurring due to the contact between a pad and a connecting line in a region where the pad overlaps with the connecting line.

Specifically, the above contact between a pad and a connecting line with which the pad overlaps occurs in mounting an electronic component such as a driving IC to the pads, due to, e.g., a pressing force applied in a direction toward the substrate (i.e., direction perpendicular to the substrate; direction from the pad to the substrate) from the pad to the connecting line with which the pad overlaps.

In regard to this, according to the above arrangement, the pads in the upper layer are softer than the connecting lines in the lower layer. This allows the above force to be relaxed (stress relaxation) by the pads in the upper layer, thereby reducing the risk of the above contact between a pad and a connecting line with which the pad overlaps.

As a result, the above arrangement prevents the occurrence of a leak failure caused by the contact between a pad and a connecting line with which the pad overlaps.

The wiring board of the present invention may be arranged so that the substrate is a display device substrate.

The wiring board of the present invention may be arranged so that the display device substrate is a glass substrate for a liquid crystal display device.

The above arrangement makes it possible to use the wiring board including the pads and the connecting lines as a display device substrate for, e.g., an electro luminescence (EL) display device or a liquid crystal display device.

This allows for a reduction of a connection region of a display device substrate. As a result, the display device substrate can be downsized by, e.g., reducing a size of a frame of a display device substrate.

The wiring board of the present invention may preferably be arranged so that the substrate is a printed wiring board.

According to the above arrangement, the wiring board is used as a printed wiring board (board for a printed wiring). This allows for, e.g., downsizing of a printed wiring board.

In order to solve the above problems, a liquid crystal display device of the present invention a wiring board including: a substrate; pads provided in a plurality of rows on the substrate; and connecting lines formed on the substrate and each connected to one of the pads; and an electronic component mounted on a corresponding pad included in the wiring board, the wiring board being a glass substrate for the liquid crystal display device, the pads arranged in the plurality of rows including: first-row pads connected to first connecting lines; and second-row pads connected to second connecting lines, the first connecting lines being longer than the second connecting lines, each of the first connecting lines being formed so as to be separated from a corresponding one of the second-row pads by at least an insulating layer, and so as to have a widthwise center in a lower region below the corresponding second-row pad, each of the first connecting lines having widthwise edges provided, in a plan view, beyond widthwise edges of a corresponding one of the second-row pads in a region in which the first connecting line overlaps with the corresponding second-row pad.

The above arrangement achieves a narrower pitch of pads provided on a glass substrate for a liquid crystal display device. This in turn allows for, e.g., reduction in size of a frame of the glass substrate or reduction in weight and thickness of, e.g., a liquid crystal display device including a glass substrate for a liquid crystal display device, the glass substrate having electronic components mounted directly thereon (chip on glass; COG).

In addition, the above arrangement reduces the risk of a leak failure occurring when, for example, an electronic component or the like is mounted. This allows for higher-yield production of liquid crystal display devices. Furthermore, in consequence, reliability of such liquid crystal display devices thus produced can be improved.

The liquid crystal display device of the present invention may be arranged so that the electronic component is mounted directly on the corresponding pad included in the wiring board so as to be connected to the glass substrate for a liquid crystal display device by chip-on-glass connection.

According to the chip-on-glass connection, chip components as electronic components are mounted directly to pads provided on the glass substrate. Thus, stress relaxation is unlikely to occur and the above insulating layer is likely to be broken.

In view of this, according to the above arrangement, each first connecting line has a widthwise center in a layer below a corresponding second-row pad. Further, each first connecting line has widthwise edges provided outside a corresponding second-row pad. This prevents the insulating layer from being broken.

As described above, the wiring board and the liquid crystal display device of the present invention are arranged so that the pads arranged in the plurality of rows include: first-row pads connected to first connecting lines; and second-row pads connected to second connecting lines, the first connecting lines being longer than the second connecting lines, each of the first connecting lines is formed so as to be separated from a corresponding one of the second-row pads by at least an insulating layer, and so as to have a widthwise center in a lower region below the corresponding second-row pad, and each of the first connecting lines has widthwise edges provided, in a plan view, beyond widthwise edges of a corresponding one of the second-row pads in a region in which the first connecting line overlaps with the corresponding second-row pad.

This allows for production of a wiring board and a liquid crystal display device, each of which has a reduced risk of a leak failure and achieves a narrower pad pitch.

BRIEF DESCRIPTION OF DRAWINGS

FIG. 10 is a view schematically illustrating a cross section taken along line F-F of FIG. 1 according to still another embodiment of the present invention.

| Reference Signs List | |
|---|---|
| 1 | wiring board |
| 2 | wiring board |
| 5 | substrate |
| 10 | metal wire (connecting line) |
| 10a | first metal wire |
| 10b | second metal wire |
| 20 | insulating layer |
| 20a | first insulating layer |
| 20b | second insulating layer |
| 25 | insulating layer |
| 30 | pad |
| 30a | first-row pad |
| 30b | second-row pad |
| 32 | pad electrode |
| 35 | pad opening |
| 40 | connecting metal section |
| 100 | wiring board |
| 101 | metal wire |
| 102 | interlayer insulating layer |
| 103 | through hole |
| 105 | pad |
| 106 | interlayer insulating layer |
| 107 | pad through hole |
| 109 | pad |
| 110 | insulating layer |
| 120 | bump |
| 130 | ACF |
| 200 | liquid crystal display device |
| 210 | frame |
| 220 | liquid crystal panel |
| 230 | electronic component |
| 240 | backlight unit |
| 300 | liquid crystal panel |
| 310 | input line |
| 320 | electrode pad |
| 400 | driving IC |
| 410 | bump |
| X | drawing region |
| Y | second connection region |
| Z | first connection region |
| PD | pad region |
| RS1 | short region |
| RS2 | short region |

DESCRIPTION OF EMBODIMENTS

One embodiment of the present invention is described below with reference to FIGS. 1 to 11. The following description compares the present invention with a conventional wiring board so as to clarify features of the present invention.

Figure 1:
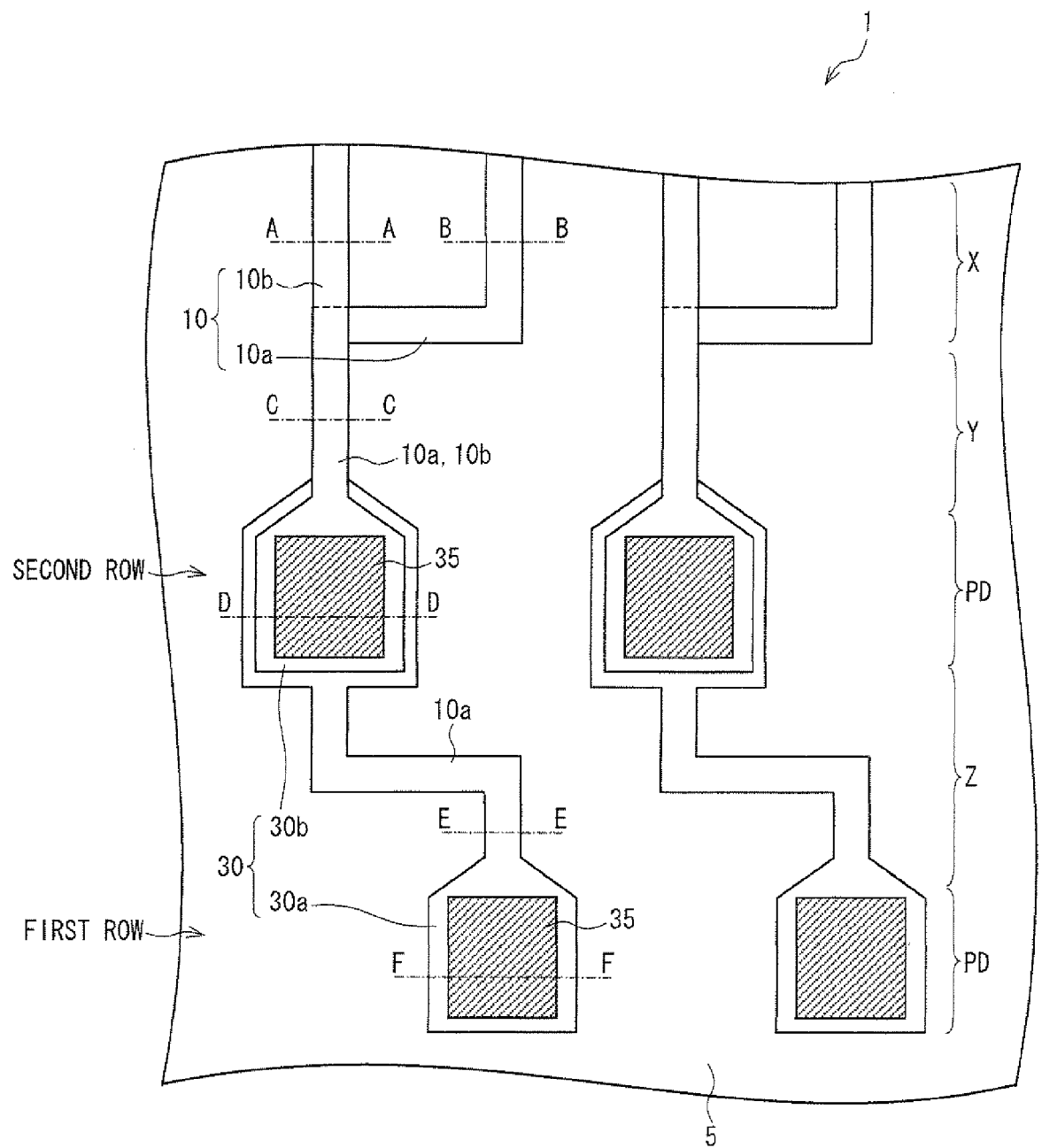
FIG. 1 is a view illustrating wiring of a wiring board according to an embodiment of the present invention.
Figure 18:
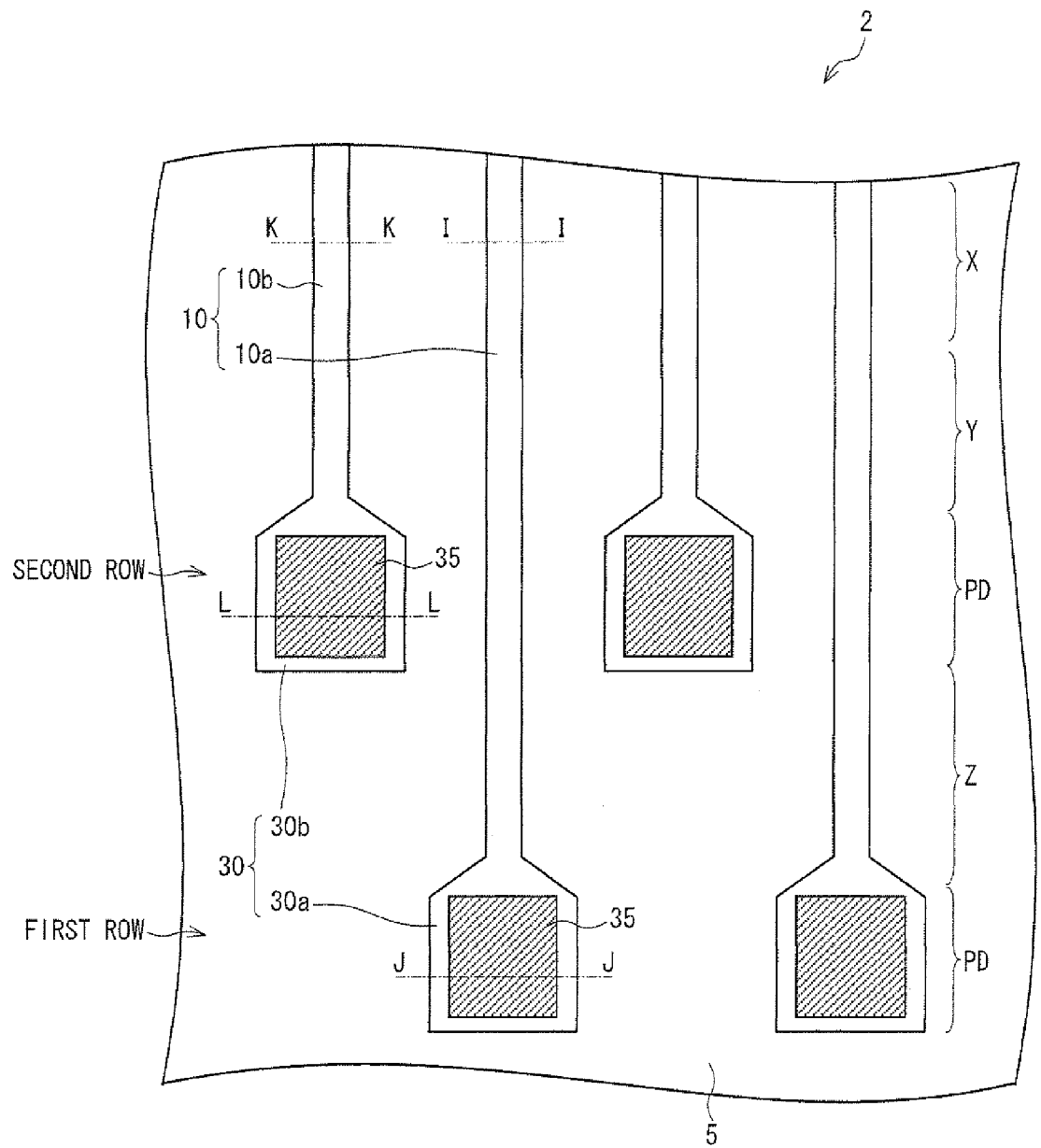
FIG. 18 is a view illustrating wiring of a wiring board according to a conventional technique.

FIG. 1 is a view illustrating wiring of a wiring board 1 of the present embodiment. FIG. 18 is a view illustrating wiring of a conventional wiring board 2 which has the same number of pads 30 as those of the wiring board 1.

(Overall Arrangement)

As illustrated in FIG. 1, the wiring board 1 of the present embodiment includes a substrate 5 provided with pads 30 each serving as an electrical contact with an electronic component such as an integrated circuit (IC); metal wires 10 each serving as a connecting line and connected to a corresponding pad 30; and insulating layers (not shown) used, e.g., to isolate the pads 30 from the metal wires 10.

Each of the pads 30 has a section where the insulating layer is not provided so as to allow electrical connection with an electronic component. In other words, the insulating layers have respective sections at each of which an opening is formed. Such sections each correspond to a pad opening 35.

(Pads)

The pads 30 on the wiring board 1 are provided in a plurality of rows, specifically in a staggered configuration. More specifically, the pads 30 are provided on the substrate 5 in two rows ("FIRST ROW" and "SECOND ROW" shown in FIG. 1). Further, respective pads 30 (first-row pads 30a forming a first row) in the first row have a pad pitch identical to a pad pitch of respective pads 30 (second-row pads 30b forming a second row) in the second row. Each pad 30a in the first row is shifted by a half of a pad pitch relative to a corresponding one of the pads 30b in the second row, and vice versa.

Such a configuration of the pads 30 is also applied in the conventional wiring board 2 illustrated in FIG. 18. Specifically, as illustrated in FIG. 18, pads 30 are arranged in first and second rows, and respective pads 30 in the first row are shifted relative to those in the second row so as to form a staggered configuration.

(Wiring)

The following describes how the pads 30 are wired.

As illustrated in FIG. 18, the conventional wiring board 2 includes wires each of which is connected to a first-row pad 30 and extends between second row pads 30b.

In contrast, according to the wiring board 1 of the present embodiment, as illustrated in FIG. 1, each first-row pad is connected to a connecting line, i.e., a first metal wire 10a, and this first metal wire 10a is formed to have a widthwise center in a lower region below a corresponding second-row pad 30b.

Each first-row pad 30a is so wired that a main portion of its corresponding first metal wire 10a, which is a connecting line, extends mainly through a region directly below a corresponding second-row pad 30b.

More specifically, according to the wiring board 1 of the present embodiment, the first metal wire 10a extends in a layer between the second-row pad 30b and the substrate 5, in a region in which the first metal wire 10a overlaps with the second-row pad 30b. Further, in this region, the first metal wire 10a has a line width larger than a width of the second-row pad 30b with which the first metal wire 10a overlaps.

In addition, the first metal wire 10a is provided so as to have a widthwise center substantially coinciding with a widthwise center of the second-row pad 30b. Consequently, in a plan view, the first metal wire 10a has widthwise edges located beyond corresponding edges of the second-row pad 30b.

The following describes a specific wiring method with reference to cross-sectional views (FIGS. 2 through 10 and FIGS. 19 through 22) of the wiring boards 1 and 2.

(Conventional)

According to the conventional wiring board 2, as illustrated in FIG. 18, first metal wires 10a each connected to a first-row pad 30a and second metal wires 10b each connected to a second-row pad 30b are provided in a single layer on the substrate 5 so as to extend from a drawing region (region X illustrated in FIG. 18) through to the pads 30 (first-row pads 30a and second-row pads 30b; pad regions PD illustrated in FIG. 18). Further, the first and second metal wires 10a and 10b are covered with a single insulating layer (not shown), except for regions requiring no insulation, such as regions via which the first and second metal wires are connected to other components.

Figure 19:
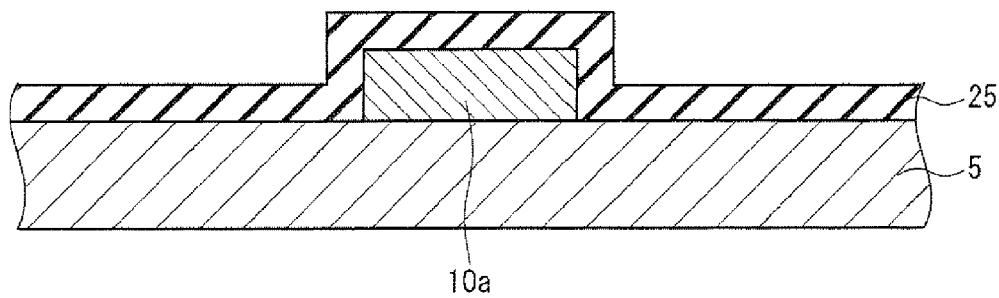
FIG. 19 is a view schematically illustrating a cross section taken along line I-I of FIG. 18.
Figure 21:
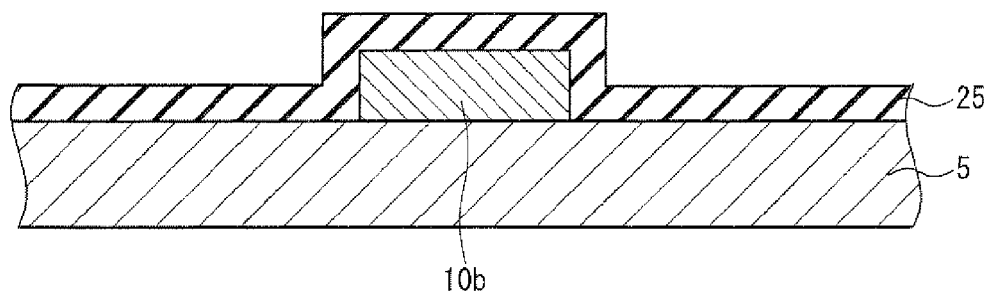
FIG. 21 is a view schematically illustrating a cross section taken along line K-K of FIG. 18.

More specifically, as illustrated in FIGS. 19 and 21, the conventional wiring board 2 includes first and second metal wires 10a and 10b which are provided in a single layer on the substrate 5 and which are made of an identical material. Further, the first and second metal wires 10a and 10b are covered with a single insulating layer 25.

FIG. 19 is a cross-sectional view (taken along line I-I of FIG. 18) of a first metal wire 10a in the drawing region X. FIG. 21 is a cross-sectional view (taken along line K-K of FIG. 18) of a second metal wire 10b in the drawing region X.

(Present Embodiment)

In contrast, according to the wiring board 1 of the present embodiment, while first metal wires 10a each connected to a first-row pad 30a and second metal wires 10b each connected to a second-row pad 30b are provided in a single layer on the substrate 5 in a drawing region (region X illustrated in FIG. 1), the first and second metal wires 10a and 10b are provided in separate layers in a second connection region (region Y illustrated in FIG. 1), in which the second metal wires 10b are connected to the corresponding second-row pads 30b.

Figure 2:
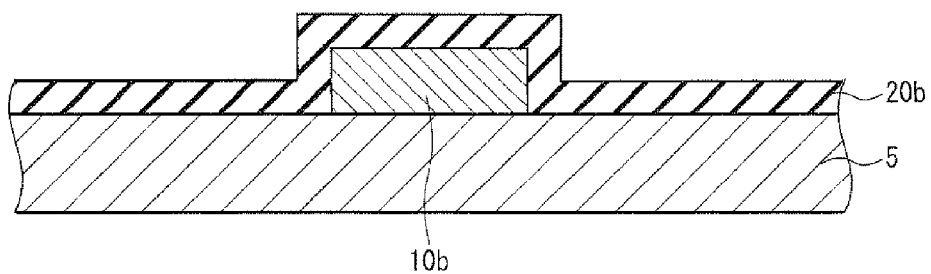
FIG. 2 is a view schematically illustrating a cross section taken along line A-A of FIG. 1.
Figure 3:
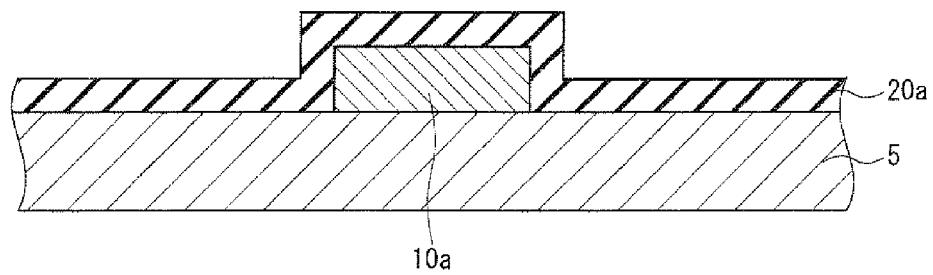
FIG. 3 is a view schematically illustrating a cross section taken along line B-B of FIG. 1.

More specifically, as illustrated in FIGS. 2 and 3, the first and second metal wires 10a and 10b are, although made of different materials as described below, provided in a single layer on the substrate 5 in the drawing region X. Further, the first and second metal wires 10a and 10b are covered with first and second insulating layers 20a and 20b, respectively.

FIG. 2 is a cross-sectional view (taken along line A-A of FIG. 1) of a second metal wire 10b in the drawing region X. FIG. 3 is a cross-sectional view (taken along line B-B of FIG. 1) of a first metal wire 10b in the drawing region X.

The first metal wire 10a then overlaps with the second metal wire 10b in a thickness direction of the substrate 5, i.e., in a direction perpendicular to the substrate 5, before the first metal wire 10a reaches a point at which the second metal wire 10b is connected to a corresponding second-row pad 30b.

Figure 4:
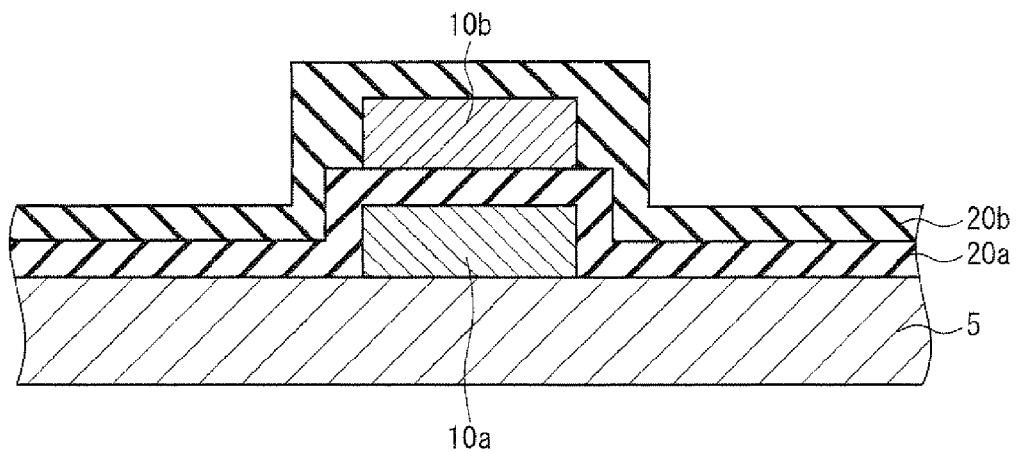
FIG. 4 is a view schematically illustrating a cross section taken along line C-C of FIG. 1.

Specifically, as illustrated in FIG. 4, in the second connection region Y, the second metal wire 10b is in a layer above the first metal wire 10a. More specifically, the first metal wire 10a is provided on the substrate 5 and is covered with the first insulating layer 20a in the same manner as shown in the cross section of FIG. 3. Further, the second metal wire 10b is provided in a layer above the first insulating layer 20a and is covered with the second insulating layer 20b.

FIG. 4 is a view (cross-sectional view taken along line C-C of FIG. 1) illustrating respective cross sections of the first and second metal wires 10a and 10b in the second connection region Y.

(Second-Row Pads)

The following describes the pads 30 in the second row.

The pads 30 in the second row, i.e., second-row pads 30b, of the wiring board 1 according to the present embodiment are each formed by increasing a width of a second metal wire 10b and forming a corresponding opening in the second insulating layer 20b.

Figure 5:
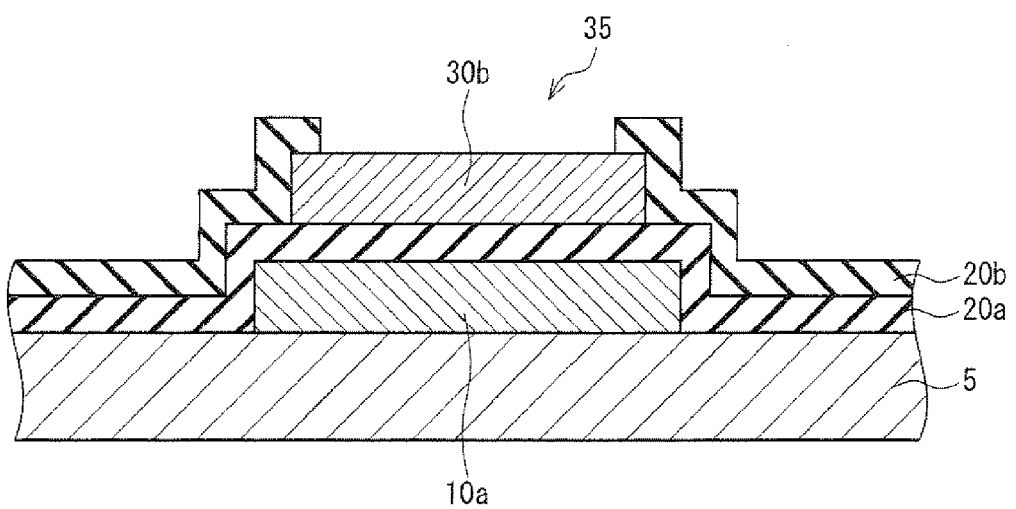
FIG. 5 is a view schematically illustrating a cross section taken along line D-D of FIG. 1.

This is explained specifically, with reference to FIG. 5 which is a cross-sectional view of a section where a second-row pad 30b is formed. As shown in FIG. 5, each second-row pad 30b is formed by increasing a line width of a second metal wire 10b included in the layered configuration present in the second connection region Y illustrated in FIG. 4.

Further, an opening is formed at a section in the second insulating layer 20b covering the second metal wire 10b in FIG. 4, thereby forming a pad opening 35 in a layer above the second-row pad 30b.

Specifically, each second-row pad 30b of the present embodiment is provided in a section on an extended line of a second metal wire 10b. In this section, a width of the second metal wire 10b is increased and the insulating layer as a surface layer is removed, for allowing electrical connection with, e.g., an electronic component (see the region PD in FIG. 1).

According to the wiring board 1 of the present embodiment, each first metal wire 10a also has a line width increased in the pad region PD corresponding to the second row, similarly to the second metal wires 10b.

Specifically, as illustrated in FIG. 5, each first metal wire 10a has, in the above pad region PD, a line width that is increased so as to be larger than a width of a corresponding second-row pad 30b. The first metal wire 10a thus having an increased line width is provided so that a widthwise center of the first metal wire 10a substantially coincides with a widthwise center of the corresponding second-row pad 30b located above the first metal wire. Consequently, the first metal wire 10a extends outwards beyond both widthwise edges of the second-row pad 30b.

In other words, as illustrated in FIG. 1 which is a plan view of the wiring board 1, each first metal wire 10a overlaps with a corresponding second-row pad in the pad region PD corresponding to the second row, and, in this pad region PD, the first metal wire 10a has widthwise edges located beyond the widthwise edges of the corresponding second-row pad 30b.

Note that there is no specific limitation to a distance by which each widthwise edge of the first metal wire 10a is apart from a corresponding edge of the second-row pad 30b, that is, a length by which the first metal wire 10a extends, in a plan view, beyond the second-row pad 30b. For example, the distance or the length may take a range presented below.

In consideration of misalignment in mounting, the above length at each widthwise edge may fall within, e.g., a range from 0.5 μm to 10 μm. This range is intended to facilitate further prevention of contact between a second-row pad 30b and a first metal wire 10a provided in a layer below another second-row pad 30*b* adjacent to the above second-row pad 30*b*, and also to facilitate further prevention of contact between first metal wires 10*a* adjacent to each other.

Figure 6:
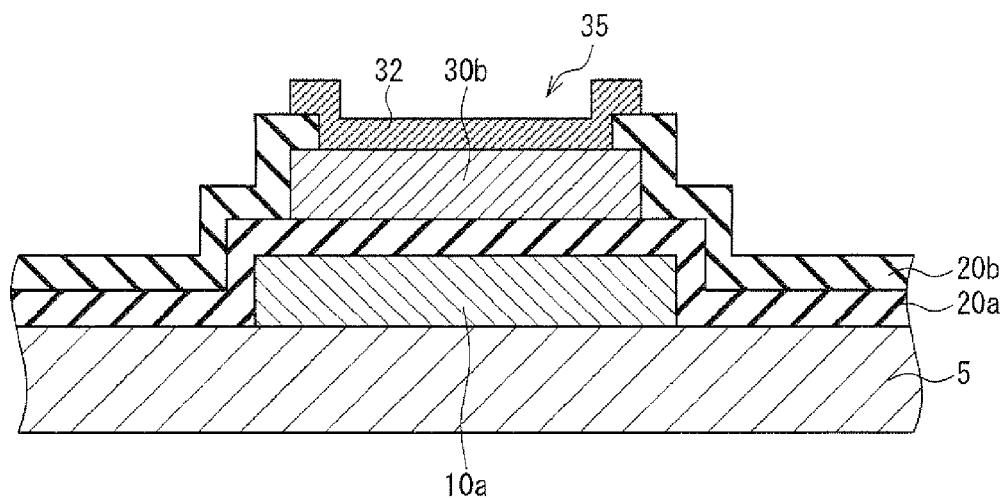
FIG. 6 is a view schematically illustrating a cross section taken along line D-D of FIG. 1 according to another embodiment of the present invention.

Note that the pads 30 in the second row are not necessarily arranged as above. For example, as illustrated in FIG. 6, each second-row pad 30*b*, formed by increasing a width of a second metal wire 10*b*, may be provided with a pad electrode 32 made of, e.g., indium tin oxide (ITO) and formed in a layer above the second-row pad 30*b*. For example, formation of the pad electrode 32 of a metal material different from a metal material of which the second metal wire 10*b* is made allows for, e.g., improvement in stability of connection with electronic components.

FIG. 5 is a cross-sectional view (taken along line D-D of FIG. 1) of a pad 30 in the second row. FIG. 6 is a cross-sectional view illustrating another arrangement of a pad 30 in the second row.

Figure 22:
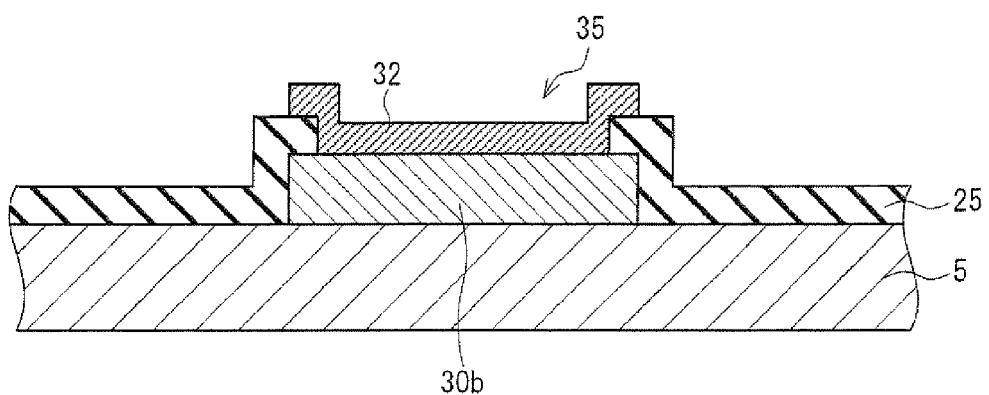
FIG. 22 is a view schematically illustrating a cross section taken along line L-L of FIG. 18.
Figure 23:
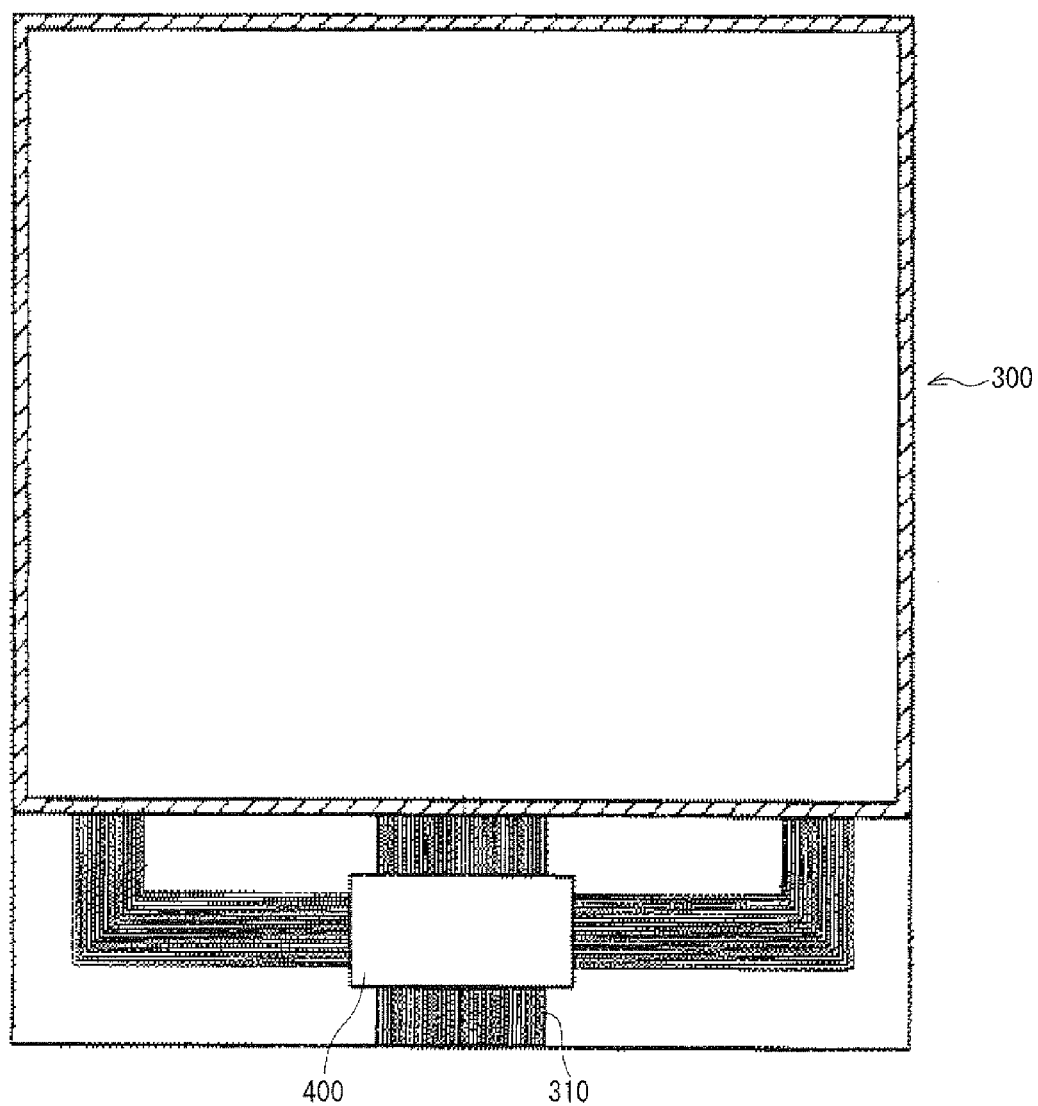
FIG. 23 is a view illustrating a configuration of a liquid crystal panel disclosed in Patent Literature 2.
Figure 24:
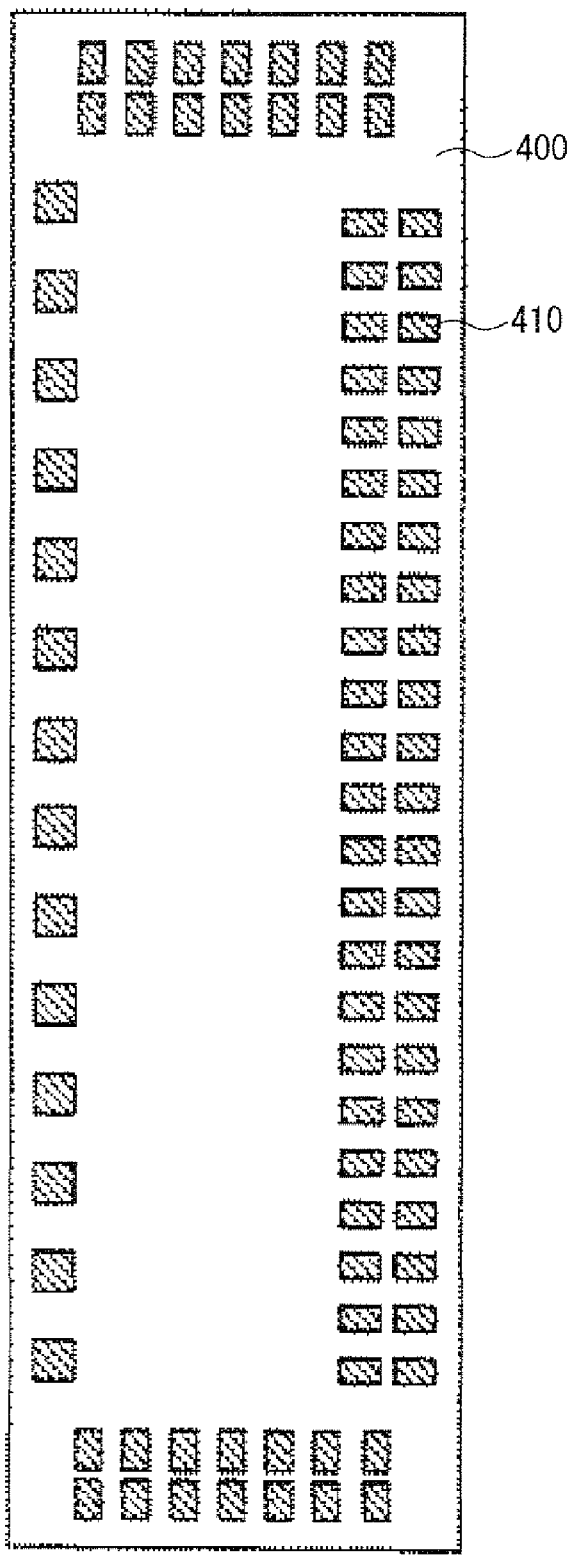
FIG. 24 is a view illustrating a configuration of a bottom surface of a driving IC shown in FIG. 23.
Figure 25:
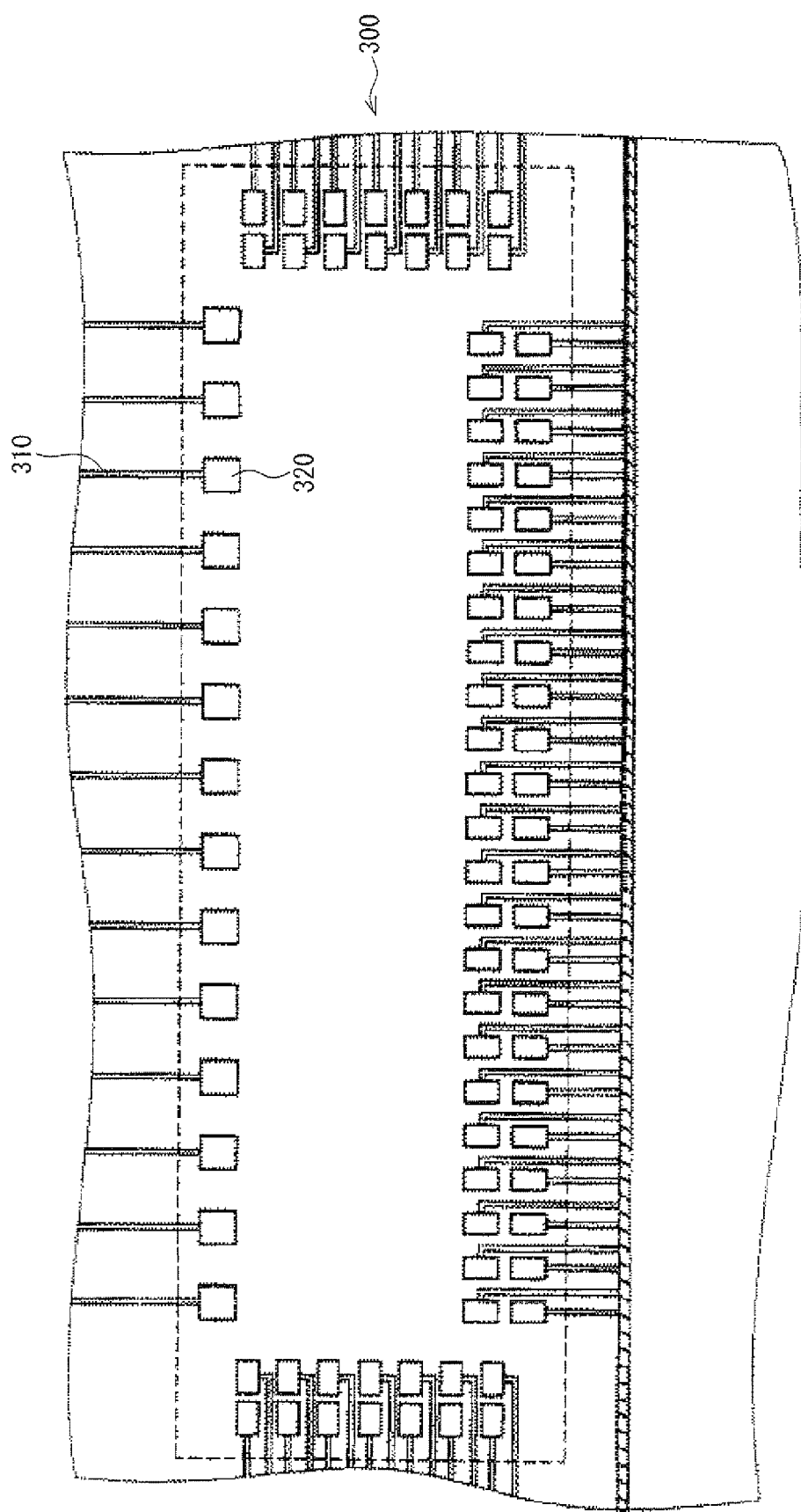
FIG. 25 is a view illustrating the liquid crystal display panel on which the driving IC shown in FIG. 24 is mounted.

The above arrangement is contrasted with the conventional wiring board 2. As illustrated in FIG. 22 which is a cross-sectional view taken along line L-L of FIG. 18, each second metal wire 10*b* has a line width increased so that a second-row pad 30*b* is provided. Further, the insulating layer 25 is caused to have a corresponding opening, so that a pad opening 35 is formed. Each second-row pad 30*b* is normally provided with a pad electrode 32 made of ITO and formed in a layer above the second-row pad 30*b*.

(First-Row Pads)

The following describes the first metal wires 10*a* and the first-row pads 30*a*.

As described above, according to the wiring board 1 of the present embodiment, each first metal wire 10*a* is drawn from a layer below a corresponding second-row pad 30*b* to a first connection region (region Z illustrated in FIG. 1) before the first metal wire 10*a* reaches a point at which the first metal wire 10*a* is connected to a corresponding first-row pad 30*a*.

In this region, the first metal wire 10*a*, which has the increased line width in the pad region PD corresponding to the second row, is narrowed so as to have a line width that is not increased, i.e., a line width identical to the line width in the second connection region Y.

Each first metal wire 10*a* whose line width is narrowed is drawn to the first connection region Z. Then, the first metal wire 10*a* is bent so as to be capable of being connected to a corresponding one of the first-row pads 30*a* whose positions are shifted relative to the respective second-row pads 30*b* in the staggered configuration. Each first metal wire 10*b* is then connected to a corresponding first-row pad 30*a*.

Figure 7:
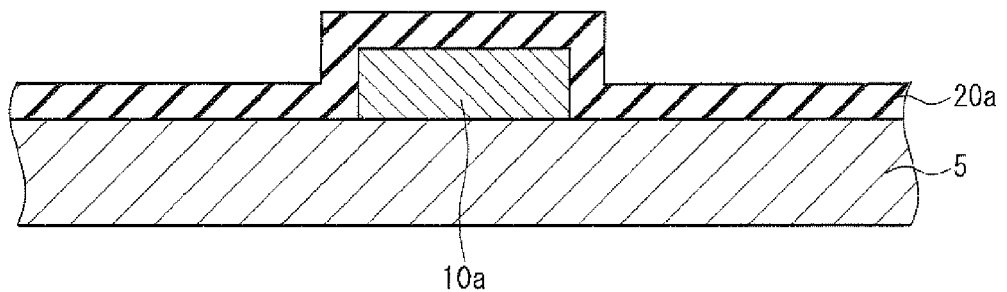
FIG. 7 is a view schematically illustrating a cross section taken along line E-E of FIG. 1.
Figure 8:
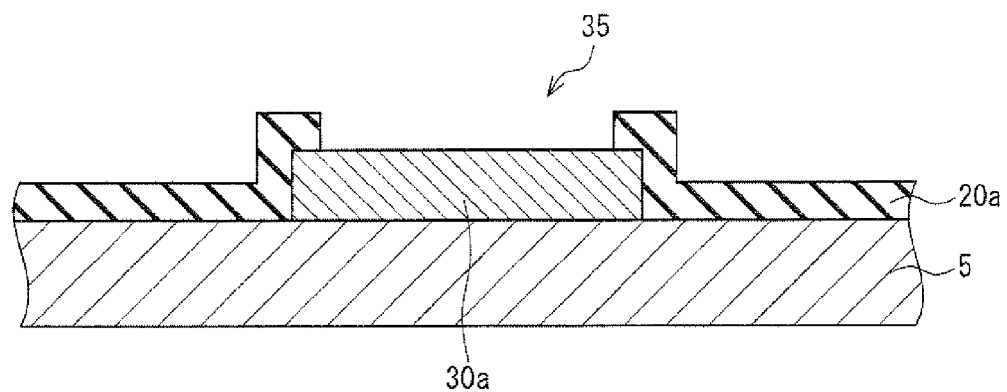
FIG. 8 is a view schematically illustrating a cross section taken along line F-F of FIG. 1.
Figure 9:
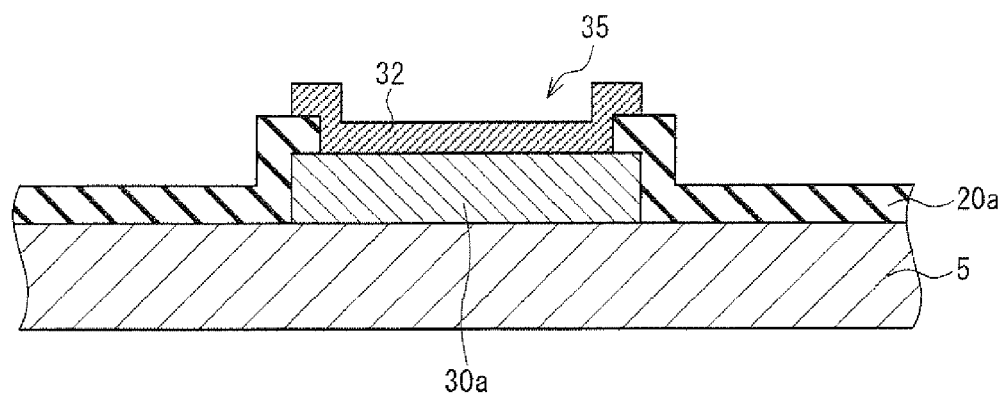
FIG. 9 is a view schematically illustrating a cross section taken along line F-F of FIG. 1 according to another embodiment of the present invention.

The following describes this in detail with reference to cross-sectional views. Both FIGS. 7 and 8 illustrate the wiring board 1 of the present embodiment. FIG. 7 is a cross-sectional view (taken along line E-E of FIG. 1) of a first metal wire 10*a* in the first connection region Z. FIG. 8 is a cross-sectional view (taken along line F-F of FIG. 1) of a first-row pad 30*a*. FIG. 9 is a cross-sectional view illustrating another arrangement of a pad 30 in the first row.

As illustrated in FIG. 7, each first metal wire 10*a* in the first connection region Z has a line width that is so narrowed as to be identical to the line width in the second connection region Y described above with reference to FIG. 4.

In the first connection region Z, no second metal wire 10*b* is provided in a layer above the first metal wire 10*a*. This is because each second metal wire 10*b* is connected to its corresponding second-row pad 30*b* and does not extend beyond the connection.

As illustrated in FIG. 8, each first metal wire 10*a* is again caused to have a line width increased in the pad region PD corresponding to the first row, thereby forming a first-row pad 30*a*.

Further, an opening is formed at a section of the first insulating layer 20*a* in a layer above the first-row pad 30*a*, thereby forming a pad opening 35. In addition, as illustrated in FIG. 9, each first-row pad 30*a* may be provided with a pad electrode 32 made of, e.g., ITO and formed in the layer above the first-row pad 30*a*. The above arrangement is similar to the equivalent of the second-row pads 30*b* described above.

Figure 20:
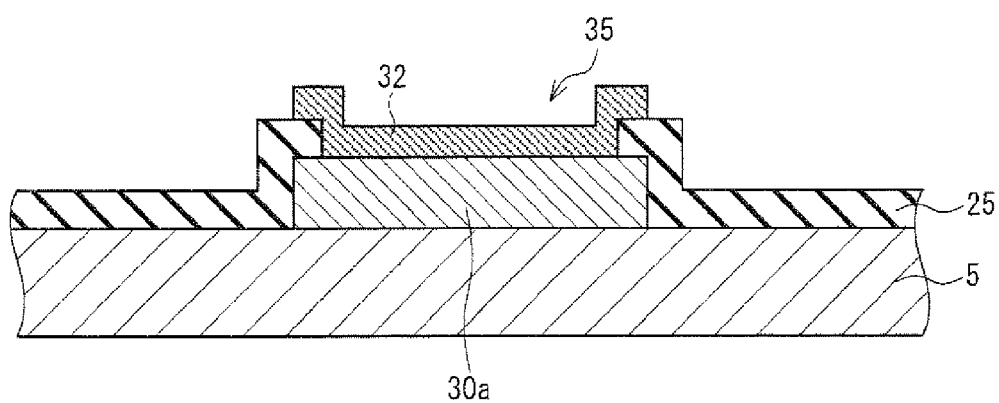
FIG. 20 is a view schematically illustrating a cross section taken along line J-J of FIG. 18.

The pads 30 in the first row of the conventional wiring board 2 are arranged similarly to those of the wiring board 1 of the present invention. Specifically, as illustrated in FIG. 20, each first-row pad 30*a* of the conventional wiring board 2 is also formed by increasing a width of a first metal wire 10*a* and an opening is formed at a section in the insulating layer 25 in the layer above the first metal wire 10*a*, as in the first-row pads 30*a* of the present embodiment. In addition, each first-row pad 30*a* is normally provided with a pad electrode 32 in a layer above the first-row pad 30*a*. Note that FIG. 20 is a cross-sectional view (taken along line J-J of FIG. 18) of a first-row pad 30*a* of the conventional wiring board 2.

(Narrower Pitch)

As described above, according to the wiring board 1 of the present embodiment, each first metal wire 10*a* is formed so as to have a widthwise center in a lower region below a corresponding second-row pad 30*b*. Further, in a plan view, the first metal wire 10*a* has widthwise edges located beyond corresponding edges of the second-row pad 30*b*, in the pad region PD corresponding to the second row.

In consequence, the wiring board 1 of the present embodiment is not likely to cause a leak failure even in a case where, for example, misalignment occurs between an electronic component and a pad in mounting, or especially in a case where a great force is applied to a pad in mounting. Further, the wiring board 1 allows a narrower pad pitch. This is described below.

According to the wiring board 1 of the present embodiment, each first metal wire 10*a* is formed so as to have a widthwise center in a lower region below a corresponding second-row pad 30*b*. This makes it possible to connect each first metal wire 10*a*, which is a line connected to a corresponding first-row pad 30*a*, to the corresponding first-row pad 30*a* without disposing a main portion of the first metal wire 10*a* between second-row pads 30*b* adjacent to each other.

In other words, each first metal wire 10*a* of the present embodiment is mostly formed, widthwise, in a lower region below a corresponding second-row pad 30*b*. Therefore, much of the first metal wire 10*a* is not provided between second-row pads 30*b* adjacent to each other.

This reduces a risk of contact between any second-row pad 30*b* and a first metal wire 10*a* provided in a lower region below another second-row pad 30*b* adjacent to the above second-row pad 30*b*, even in a case where a distance between such second-row pads 30*b* adjacent to each other is reduced. In addition, even in the case where the distance between such second-row pads 30*b* adjacent to each other is reduced, first metal wires 10*a* each provided in a lower region below a corresponding one of the second-row pads 30*b* become unlikely to come into contact with each other.

As a result, the wiring board 1 of the present embodiment facilitates achieving a narrower pad pitch.

(Leak Failure)

According to the wiring board 1 of the present embodiment, each first metal wire 10*a* is formed so as to have a widthwise center, not between second-row pads 30b adjacent to each other, but in a lower region below a corresponding second-row pad 30b.

This prevents each second-row pad 30b from easily coming close to a corner portion of a first metal wire 10a and coming in contact with the corner portion that is located between its adjacent second-row pads 30b.

Figure 17:
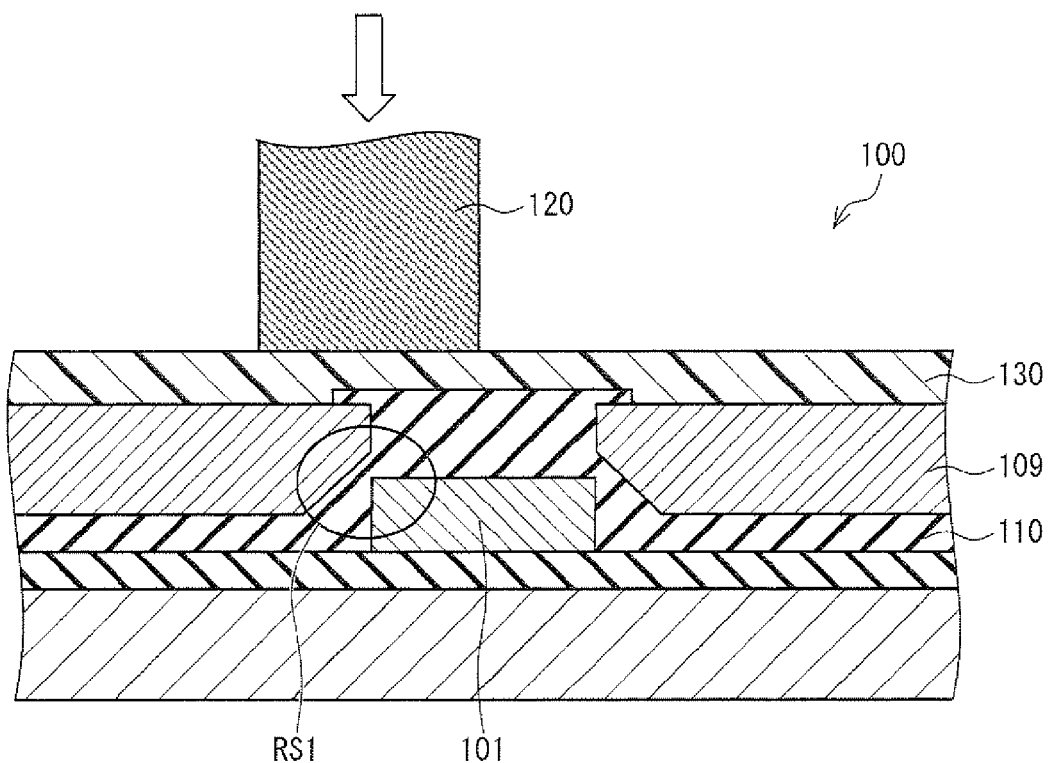
FIG. 17 is a view illustrating a condition where an IC misaligned is being mounted to a wiring board.

As described above with reference to FIG. 17, the contact between a second-row pad 30b and a first metal wire 10a is likely to occur in the case where (i) each first metal wire 10a is formed between second-row pads 30b adjacent to each other and (ii) a distance between each second-row pad 30b and a first metal wire 10a adjacent to the each second-row pad 30b is reduced for allowing the second-row pads 30b to have a narrower pitch.

In view of this, each first metal wire 10a of the wiring board 1 according to the present embodiment has a widthwise center in a lower region below a corresponding second-row pad 30b. This prevents the occurrence of a leak failure caused by the contact between a second-row pad 30b and a corner portion of a first metal wire 10a.

As described above, the wiring board 1 of the present embodiment reduces the risk of the occurrence of a leak failure and also achieves a narrower pad pitch at the same time.

Figure 12:
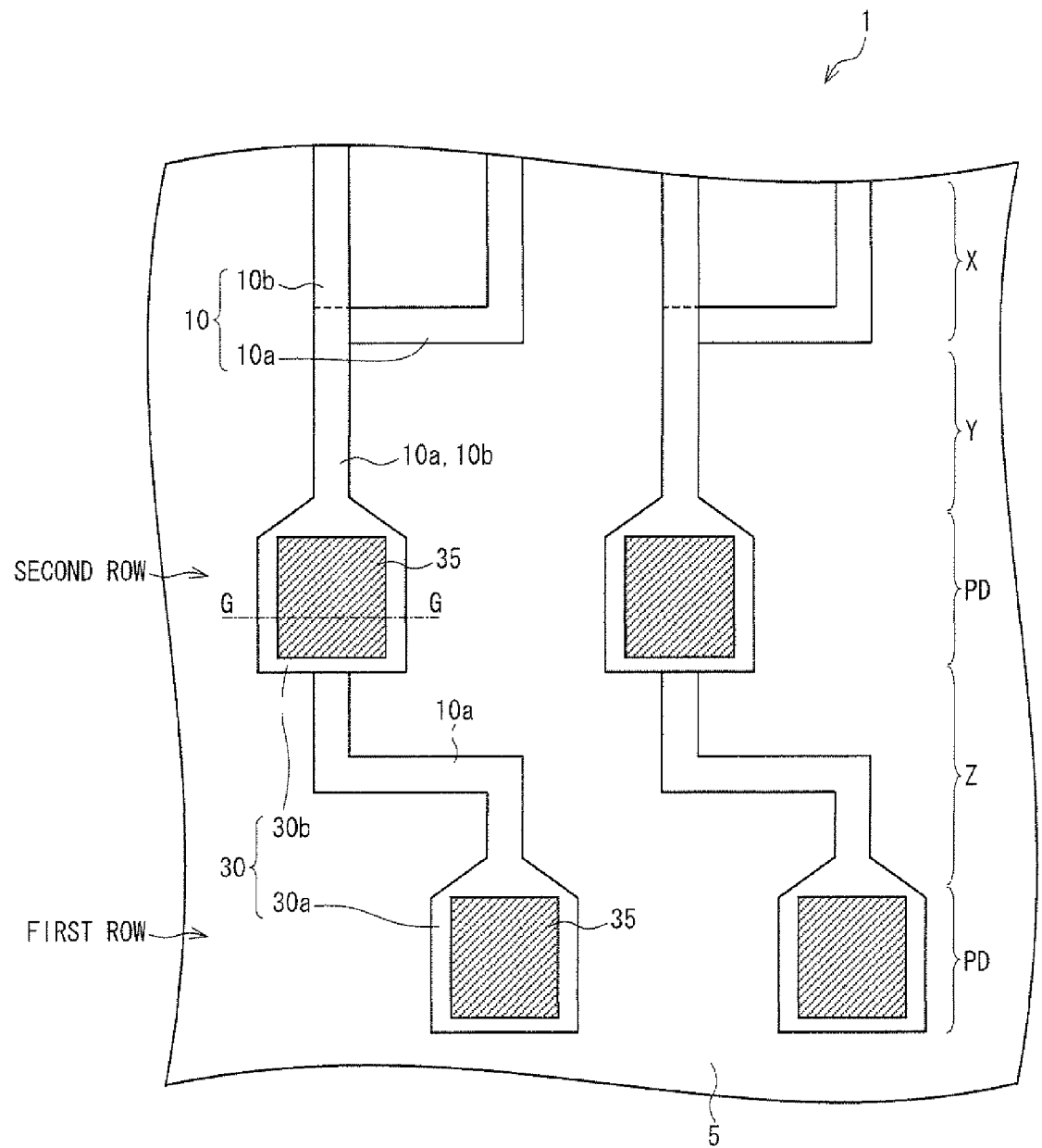
FIG. 12 is a view illustrating wiring of a wiring board including pads arranged in a staggered configuration.

To prevent the occurrence of the leak failure (leak failure described above with reference to FIG. 17; hereinafter referred to as a case-1 leak failure) without precluding the achievement of a narrow pitch, the wiring board may be arranged as illustrated in FIG. 12. FIG. 12 is a view illustrating wiring of a wiring board which includes pads arranged in two rows in a staggered configuration.

According to the configuration illustrated in FIG. 12, each first metal wire 10a, which is a connecting line 10 connected to a pad 30 (first-row pad 30a) in a first row, extends through a lower region below a corresponding second-row pad 30b, in a region (pad region PD illustrated in FIG. 12) where pads 30 in a second row are formed. In this pad region PD, the first metal wire 10a has a line width smaller than a width of the corresponding second-row pad 30b. Further, in a plan view, the first metal wire 10a is provided in a region directly below the second-row pad 30b so as not to extend beyond the second-row pad 30b widthwise.

Figure 13:
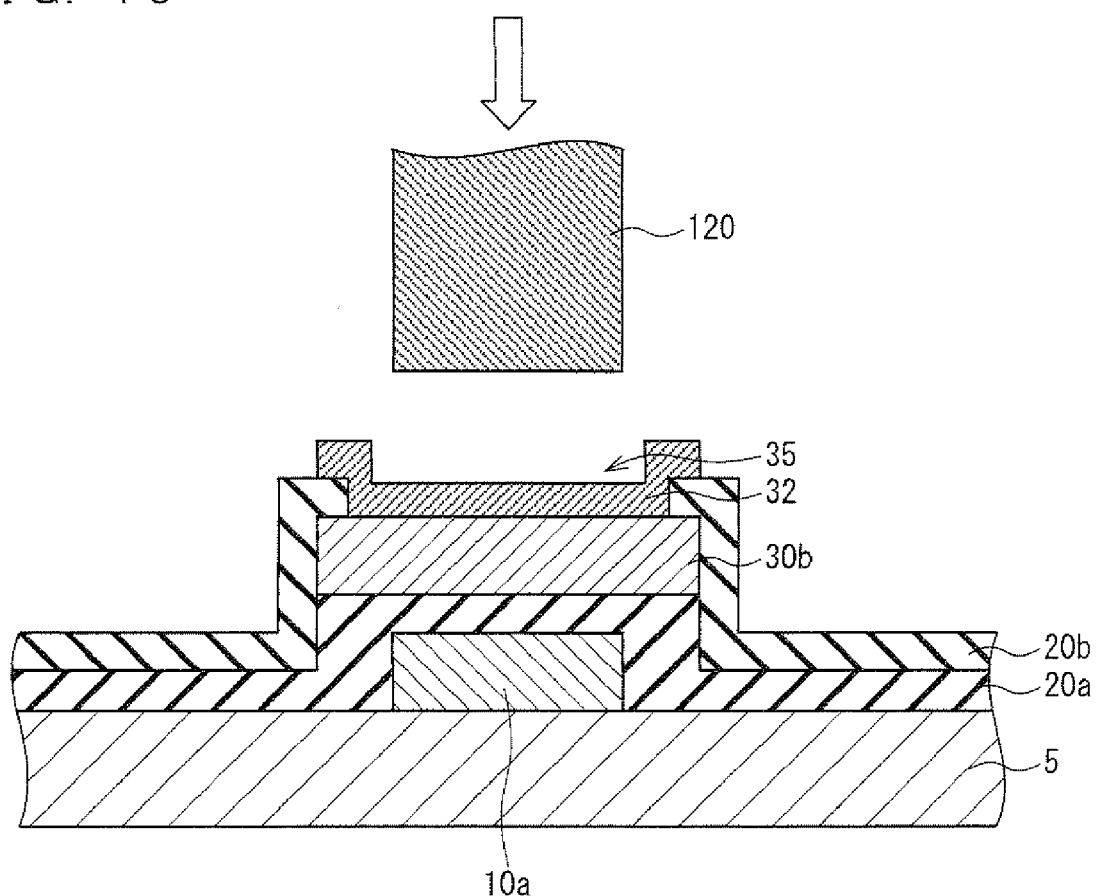
FIG. 13 is a view schematically illustrating a cross section taken along line G-G of FIG. 12.

More specifically, as illustrated in FIG. 13 schematically illustrating a cross section taken along line G-G of FIG. 12, the first metal wire 10a is provided between the second-row pad 30b and the substrate 5. The first metal wire 10a has a line width smaller than a width of the second-row pad 30b. Further, the first metal wire 10a is covered by the second-row pad 30b which is formed in a layer above the first metal wire 10a.

The second-row pad 30b and the first metal wire 10a sandwiches a first insulating layer 20a for insulating the second-row pad 30b and the first metal wire 10a from each other. The second-row pad 30b is provided with a pad electrode 32 formed in a layer above the second-row pad 30b.

As described above, in the above arrangement, each first metal wire 10a is formed only in a region directly below the corresponding second-row pad 30b. This allows the second-row pads 30b to have a narrower pitch and also prevents the occurrence of a case-1 leak failure.

(Leak Failure: Case 1)

The above arrangement, however, may cause a leak failure due to, e.g., sinking of a second-row pad 30b. This is described below.

As described above, electronic components such as a driving IC are mounted to the second-row pads 30b. Specifically, each bump 120 of an electronic component is, for example, joined, by compression in a direction indicated by an arrow shown in FIG. 13, to a second-row pad 30b (more specifically, to a pad electrode 32 formed on the second-row pad 30b). This causes a current to flow between the electronic component and the second-row pads 30b.

The electronic component may be mounted with a great force (indicated by the arrow shown in FIG. 13) that is applied from each bump 120 of the electronic component to a corresponding second-row pad 30b so as to press the second-row pad 30b toward the substrate 5. In this case, the above force may deform the second-row pad 30b.

Figure 14:
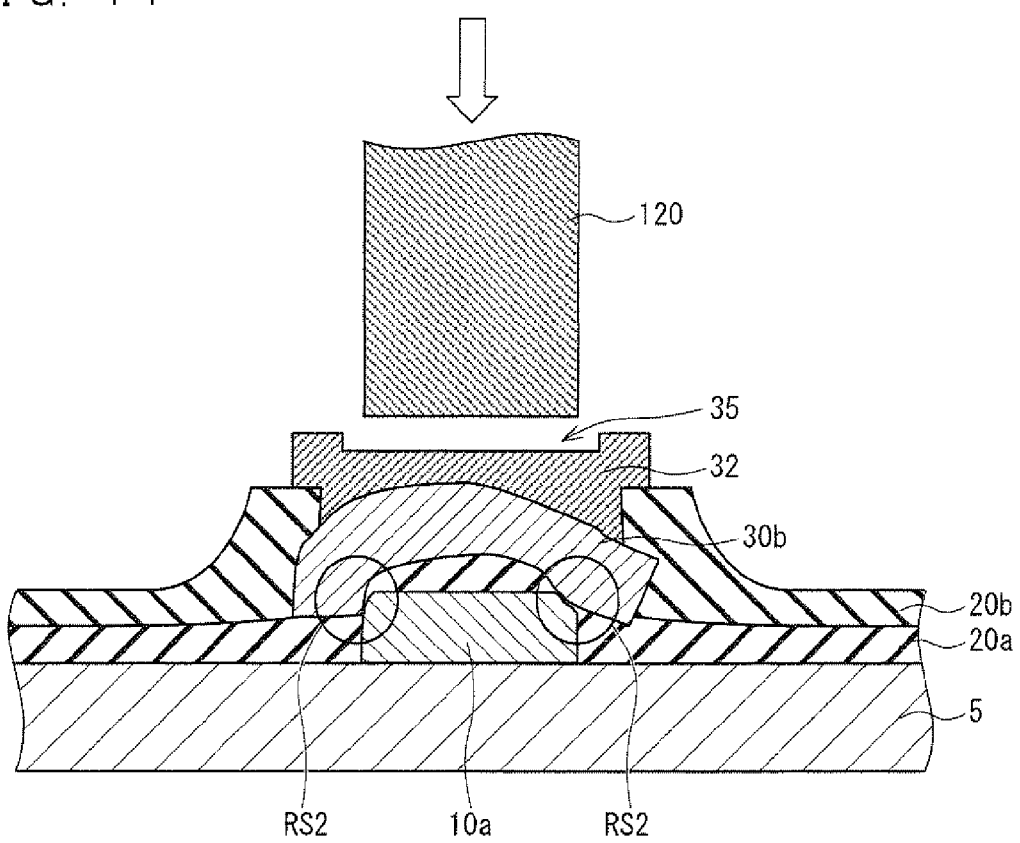
FIG. 14 is a view illustrating a condition where an electronic component is being mounted to the wiring board.
Figure 15:
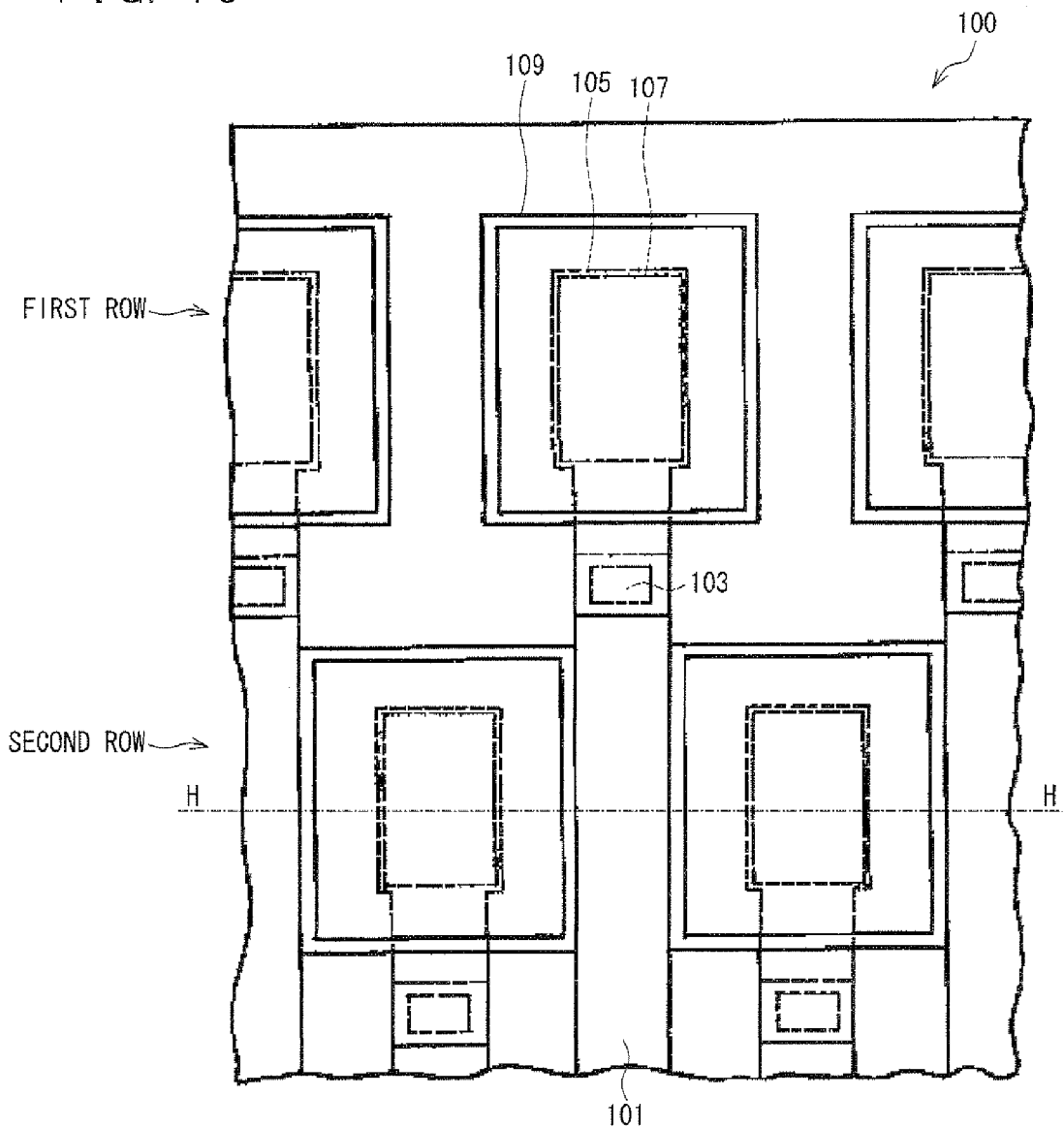
FIG. 15 is a view illustrating a configuration of a wiring board disclosed in Patent Literature 1.
Figure 16:
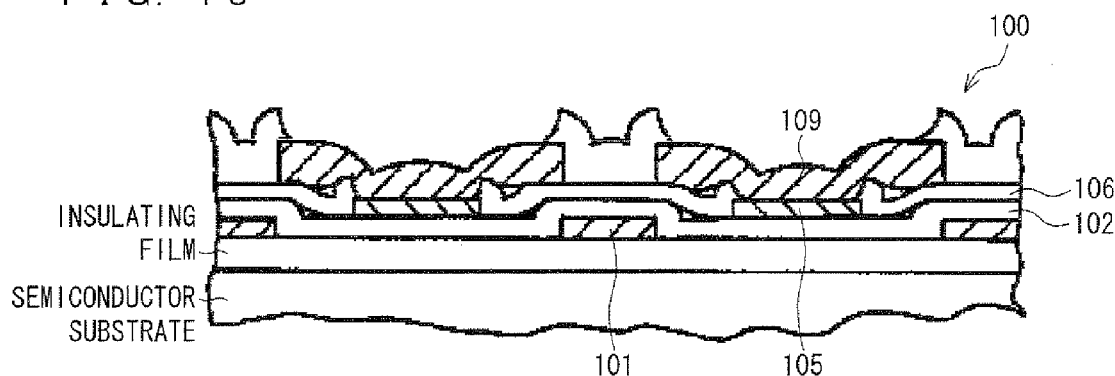
FIG. 16 is a cross-sectional view taken along line H-H of FIG. 15.

The following description refers to FIG. 14. FIG. 14 is a view illustrating a condition where an electronic component is being mounted to a wiring board. More specifically, FIG. 14 is a cross-sectional view illustrating how a second-row pad 30b is deformed by force applied from a bump 120 of the electronic component.

As illustrated in FIG. 14, in the case where, for example, a bump 120 of the electrical component presses a corresponding second-row pad 30b with a significantly great force when the electronic component is mounted, the second-row pad 30b may be curved into a concave shape such that edges of the second-row pad 30b are depressed toward the substrate 5. In a case where the curve is steep, the second-row pad 30b may break the second insulating layer 20b separating the second-row pad 30b from a corresponding first metal wire 10a. This in turn causes the second-row pad 30b to be in contact with the first metal wire 10a, thereby causing a leak failure. This contact between a second-row pad 30b and a first metal wire 10a is likely to occur in a region (each short region RS2 in FIG. 14) near a corner portion at each end of the first metal wire 10a.

As described above, other than the case-1 leak failure described above, a leak failure may also occur in the case where a pad comes into contact with a corner portion of a connecting line formed in a region directly below the pad (case 2).

As described above, the arrangement illustrated in FIG. 12 prevents the occurrence of a case-1 leak failure described above with reference to FIG. 17, without precluding the achievement of a narrower pitch. However, in the case where, for example, a significantly great force is applied to a corresponding pad from an electronic component in mounting, a case-2 leak failure described above with reference to FIG. 14 may occur.

In view of this, the wiring board 1 of the present embodiment prevents not only the occurrence of a case-1 leak failure, but also the occurrence of a case-2 leak failure. This is described below.

(Leak Failure: Case 2)

In a plan view, each first metal wire 10a of the wiring board 1 according to the present embodiment has widthwise edges located beyond widthwise edges of a corresponding second-row pad 30b, in the pad region PD corresponding to the second row.

Consequently, even in the case where an electronic component is mounted to the wiring board 1 with a great force that is applied from each bump 120 or the like of the electronic component to a corresponding second-row pad 30b so as to press the second-row pad 30b toward the substrate 5, the second-row pad 30b is unlikely to come into contact with a first metal wire 10a formed in a layer below the second-row pad 30b. This reduces a risk of the occurrence of a case-2 leak failure. This is described below.

As described above with reference to FIG. 14, a case-2 leak failure occurs when a force applied to a second-row pad 30b deforms the second-row pad 30b and thus causes the second-row pad 30b to come into contact with a corresponding connecting line (first metal wire 10a).

This contact between the second-row pad 30b and a first metal wire 10a caused by the deformation of the second-row pad 30b is likely to occur as follows. In the case where the second-row pad 30b has a width larger than a width of the first metal wire 10a formed in a layer below the second-row pad 30b, the above force curves the second-row pad 30b toward the substrate 5 into a concave shape. The second-row pad 30b thus curved consequently comes into contact with corner portions at the respective edges of the first metal wire 10a.

In view of this, as illustrated in, e.g., FIG. 5, in the arrangement of the present embodiment, each first metal wire 10a has a width larger than a width of a second-row pad 30b located in a layer above the first metal wire 10a. In other words, each second-row pad 30b has a width smaller than a width of a first metal wire 10a located in a layer below the second-row pad 30b.

According to the wiring board 1 of the present embodiment, each second-row pad 30b has a widthwise center substantially coinciding with a widthwise center of a first metal wire 10a located in a layer below the second-row pad 30b. Hence, each first metal wire 10a is formed in a layer below a corresponding second-row pad 30b so as to be present allover a region directly below the corresponding second-row pad 30b. In other words, each second-row pad 30b is formed so that a whole of the second-row pad 30b is on a corresponding first metal wire 10a.

Consequently, even in the case where a great force is applied, in mounting an electronic component, to a second-row pad 30b so as to press the second-row pad 30b toward the substrate 5, the second-row pad 30b is unlikely to be deformed, e.g., curved toward the substrate 5 into a concave shape. This reduces a risk of breakage of the first insulating layer 20a which is an insulating layer below the second-row pad 30b. This in turn reduces a risk of the second-row pad 30b coming into contact (electrical short circuit) with corner portions at respective edges of the first insulating layer 20a formed in a lower region below the second-row pad 30b. As a result, a case-2 leak failure described above with reference to FIG. 14 is unlikely to occur.

Namely, the wiring board 1 of the present embodiment prevents not only a case-1 leak failure, but also a case-2 leak failure which occurs when a second-row pad 30b is so deformed as to come into contact with a first metal wire 10a in a layer below the second-row pad 30b.

As described above, according to the wiring board 1 of the present invention, a leak failure is unlikely to occur even in the case where misalignment is caused in mounting, or especially in the case where a great force is applied to a pad in mounting. The wiring board 1 also achieves a narrower pad pitch at the same time.

(COG)

The above effect of preventing the occurrence of a leak failure is significant in a case where the wiring board 1 of the present embodiment is used for a chip-on-glass connection. The chip-on-glass (COG) connection refers to a connection in which a component such as a semiconductor chip is mounted directly to a glass substrate.

One specific example is a case where the wiring board 1 is used as a glass substrate for a liquid crystal display device and a chip component such as a driving IC is mounted directly to the glass substrate for a liquid crystal display device.

According to the chip-on-glass connection, the chip component is mounted directly to pads provided on the glass substrate. Thus, interlayer stress relaxation is unlikely to occur, and the above insulating layer tends to be broken. This indicates that, for example, misalignment caused in mounting is especially likely to result in a leak failure between a pad and a connecting line.

In view of this, according to the wiring board 1 of the present embodiment, as described above, each first metal wire 10a has a widthwise center in a layer below a corresponding second-row pad 30b. Further, the first metal wire 10a has widthwise edges located beyond widthwise edges of the corresponding second-row pad 30b. This prevents the occurrence of the above leak failures.

The above description deals with the arrangement in which each first-row pad 30a is formed by increasing a width of a first metal wire 10a, whereas each second-row pad 30b is formed by increasing a width of a second metal wire 10b. However, respective arrangements of the pads 30 of the present invention are not limitedly arranged as above.

For example, the first-row pads 30a may be made of a material different from a material of which the first metal wires 10a are made, or may each be formed in a layer different from a corresponding first metal wire 10a. Similarly, the second-row pads 30b may be made of a material different from a material of which the second metal wires 10b are made, or may each be formed in a layer different from its corresponding second metal wire 10b.

The above description deals with the arrangement of the pads 30 in the first row with reference to FIG. 8. In the arrangement, the first-row pads 30a are formed in a layer in which the first metal wires 10a are formed, by increasing a width of each first metal wire 10a. However, the pads 30 in the first row of the present invention are not limitedly arranged as above.

For example, as illustrated in FIG. 10, each first-row pad 30a formed by increasing a width of a first metal wire 10a may additionally be provided with a connecting metal section 40 which is made of, e.g., a material similar to a material of which the second metal wires 10b are made and which is formed in a layer above the first-row pad 30a. Further, according to need, the connecting metal section 40 may be provided with a pad electrode 32, as described above, formed in a layer above the connecting metal section 40.

This arrangement reduces a height difference between the pads 30 in the first row and those in the second row. This in turn enables more reliable mounting.

(Metal Materials)

The following describes metal materials used to form the metal wires (first and second metal wires 10a and 10b) and the pads (first-row and second-row pads 30a and 30b).

As described above with reference to FIG. 5, each first metal wire 10a of the wiring board 1 according to the present embodiment extends through a layer below a corresponding second-row pad 30b.

In the present embodiment, the second-row pads 30b are preferably made of a material different from a material of which the first metal wires 10a are made.

According to the present embodiment, each second-row pad 30b is formed by increasing a line width of a second metal wire 10b on an extended line of the second metal wire 10b. Thus, the second-row pads 30b and the second metal wires 10b are made of an identical metal material.

TABLE 1

|  | Combination 1 | Combination 2 | Combination 3 | Combination 4 |
|---|---|---|---|---|
| Second-row pad | Al | Al | Al | Ti |

TABLE 1-continued

|  | Combination 1 | Combination 2 | Combination 3 | Combination 4 |
|---|---|---|---|---|
| First metal wire | Ti/TiN | Ta/TaN | Ni | Ni |
| First and second insulating layers | SiN, SiO$_2$ | SiN, SiO$_2$ | SiN, SiO$_2$ | SiN, SiO$_2$ |

Table 1 shows respective materials of (i) the second-row pads 30, (ii) the first metal wires 10a, and (iii) the first and second insulating layers 20a and 20b.

As shown in Table 1, according to the wiring board 1 of the present embodiment, the material of the second-row pads 30b is softer than that of the first metal wires 10a.

Specifically, in general, the order of hardness of metals (on the Mohs hardness scale) is Ni>Ti>Al. Thus, for example, the material of the second-row pads 30b is softer than that of the first metal wires 10a in a case of Combination 1 in Table 1, where the second-row pads 30b are made of Al (aluminum) and the first metal wires 10a are made of an alloy of Ti (titanium) and TiN (titanium nitride).

The material of the second-row pads 30b is softer than that of the first metal wires 10a in the case of any other Combination 2, 3, or 4 as well.

According to this arrangement, in mounting, each second-row pad 30b in an upper layer is made of a material softer than a material of a corresponding first metal wire 10a in a lower layer. This reduces the risk of any second-row pad 30b coming into contact with a first metal wire 10a in a layer below the second-row pad 30b, thereby reducing the risk of the occurrence of a leak failure.

Specifically, an IC or the like is mounted to second-row pads 30b, with a force applied from, e.g., each bump of the IC to a layered body of a corresponding second-row pad 30b and a first metal wire 10a so as to press the layered body toward the substrate 5.

The above force may cause the second-row pad 30b in the upper layer to come into contact with the first metal wire 10a in the lower layer. In view of this, in the above arrangement, the second-row pads 30b in the upper layer are softer than the first metal wires 10a in the lower layer. Thus, the above force is relaxed (stress relaxation) by the second-row pads 30b in the upper layer. As a result, the second-row pads 30b are unlikely to come into contact with the respective first metal wires.

Figure 26:
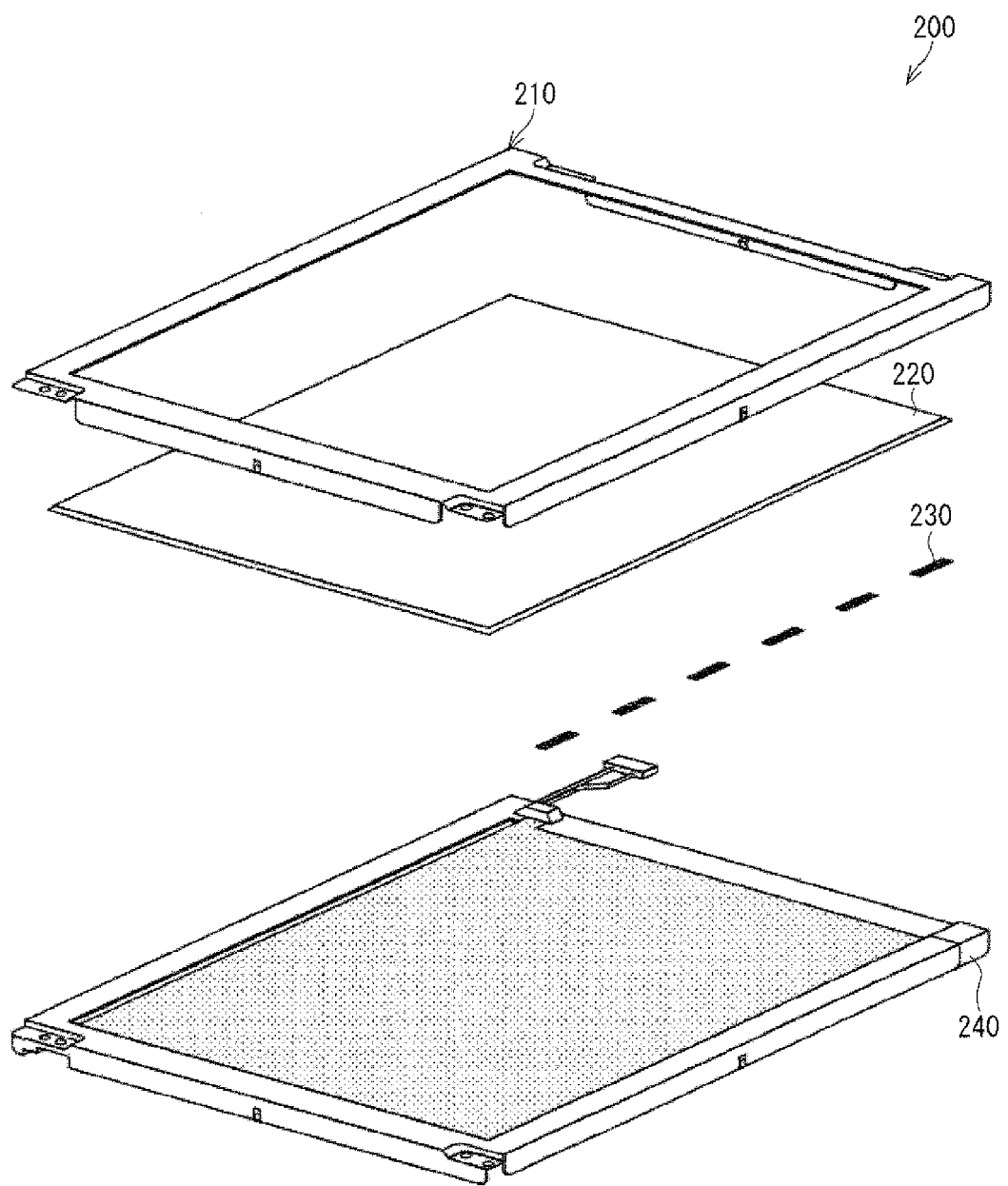
FIG. 26 is a view schematically illustrating an arrangement of a liquid crystal display device according to an embodiment of the present invention.

The wiring board of the present invention is applicable to various electronic devices; for example, it is suitably applicable to a liquid crystal display device. FIG. 26 is a view schematically illustrating an arrangement of a liquid crystal display device 200 including the wiring board of the present invention.

As illustrated in FIG. 26, the liquid crystal display device 200 includes: a frame 210; a liquid crystal panel 220; electronic components 230 provided to the liquid crystal panel 220; and a backlight unit 240. For example, the wiring board of the present invention is applicable to a glass substrate for liquid crystal display device, the glass substrate constituting the liquid crystal panel 220.

The present invention is not limited to the description of the embodiment above, but may be altered by a skilled person within the scope of the claims. An embodiment based on any combination of technical means properly modified within the scope of the claims is also encompassed in the technical scope of the present invention.

(Arrangement of Pads)

Another embodiment of the present invention is achieved by, for example, an arrangement in which the first-row and second-row pads 30a and 30b are arranged differently from the above.

The above embodiment describes the wiring board 1 including the first-row and second-row pads 30a and 30b arranged in a staggered configuration as illustrated in FIG. 1. However, the wiring board 1 of the present invention is not limitedly arranged as such.

Figure 11:
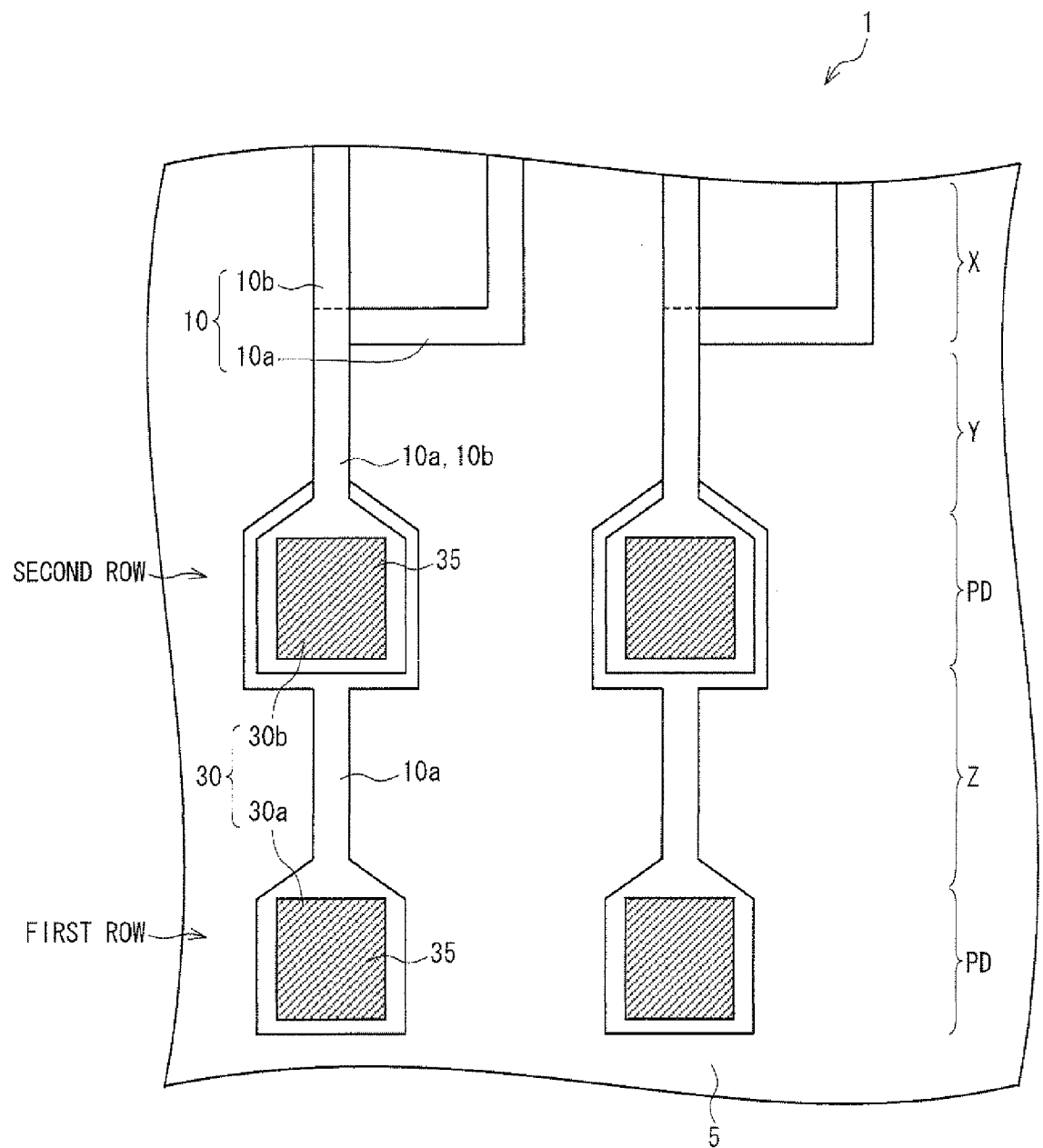
FIG. 11 is a view illustrating wiring of a wiring board according to yet another embodiment of the present invention.

For example, as illustrated in FIG. 11 which illustrates wiring of the wiring board 1 in a plan view, another possible arrangement is such that each first-row pad 30a and a corresponding second-row pad 30b are provided in a straight line, different from the staggered configuration.

Regarding the pads arranged in a plurality of rows, the above embodiment deals with the arrangement including two rows for simplification of the description. However, the wiring board of the present invention does not limitedly include two rows of pads. The number of the rows may, for example, be larger, e.g., three or four.

Industrial Applicability

The wiring board of the present invention achieves a narrower pad pitch, and is therefore suitable for applications requiring high-density mounting.

The invention claimed is:

1. A wiring board comprising:
a substrate;
pads provided in a plurality of rows on the substrate; and
connecting lines formed on the substrate and each connected to one of the pads,
the pads arranged in the plurality of rows including: first-row pads connected to first connecting lines; and second-row pads connected to second connecting lines,
the first connecting lines being longer than the second connecting lines,
each of the first connecting lines being formed so as to be separated from a corresponding one of the second-row pads by at least an insulating layer, and so as to have a widthwise center in a lower region below the corresponding second-row pad,
each of the first connecting lines having widthwise edges provided, in a plan view, beyond widthwise edges of a corresponding one of the second-row pads in a region in which the first connecting line overlaps with the corresponding second-row pad, wherein
each pad of the first-row pads is shifted in a lateral direction relative to a corresponding pad in the second-row pads;
a previous width of each of the first connecting lines expands to a subsequent width greater than a width of the corresponding second-row pad when the first connecting line overlaps with the corresponding second-row pad;
the subsequent width of each of the first connecting lines shrinks back to substantially the previous width at a location where the first connecting line no longer overlaps with the corresponding second-row pad; and
each of the first connecting lines is an integral component without comprising multiple components connected together.

2. The wiring board according to claim 1, wherein each of the second-row pads is formed by increasing a line width of a corresponding one of the second connecting lines.

3. The wiring board according to claim 1, wherein the second-row pads are softer than the first connecting lines.

4. The wiring board according to claim 3, wherein:
the second-row pads are made of aluminum; and the first connecting lines are made of any one of titanium, titanium nitride, an alloy of titanium and titanium nitride, tantalum, tantalum nitride, and an alloy of tantalum and tantalum nitride.

5. The wiring board according to claim 3, wherein:
the second-row pads are made of aluminum or titanium; and
the first connecting lines are made of nickel.

6. The wiring board according to claim 1, wherein the substrate is a display device substrate.

7. The wiring board according to claim 6, wherein the display device substrate is a glass substrate for a liquid crystal display device.

8. The wiring board according to claim 1 wherein the substrate is a printed wiring board.

9. A liquid crystal display device comprising:
a wiring board including: a substrate; pads provided in a plurality of rows on the substrate; and connecting lines formed on the substrate and each connected to one of the pads; and
an electronic component mounted on a corresponding pad included in the wiring board,
the wiring board being a glass substrate for the liquid crystal display device,
the pads arranged in the plurality of rows including: first-row pads connected to first connecting lines; and second-row pads connected to second connecting lines,
the first connecting lines being longer than the second connecting lines,
each of the first connecting lines being formed so as to be separated from a corresponding one of the second-row pads by at least an insulating layer, and so as to have a widthwise center in a lower region below the corresponding second-row pad,
each of the first connecting lines having widthwise edges provided, in a plan view, beyond widthwise edges of a corresponding one of the second-row pads in a region in which the first connecting line overlaps with the corresponding second-row pad, wherein
each pad of the first-row pads is shifted in a lateral direction relative to a corresponding pad in the second-row pads;
a previous width of each of the first connecting lines expands to a subsequent width greater than a width of the corresponding second-row pad when the first connecting line overlaps with the corresponding second-row pad;
the subsequent width of each of the first connecting lines shrinks back to substantially the previous width when the first connecting line no longer overlaps with the corresponding second-row pad; and
each of the first connecting lines is an integral component without comprising multiple components connected together.

10. The liquid crystal display device according to claim 9, wherein the electronic component is mounted directly on the corresponding pad included in the wiring board so as to be connected to the glass substrate for a liquid crystal display device by chip-on-glass connection.

* * * * *